(12) United States Patent
McElvain et al.

(10) Patent No.: US 6,208,006 B1
(45) Date of Patent: Mar. 27, 2001

(54) THIN FILM SPATIAL FILTERS

(75) Inventors: Jon S. McElvain; John L. Langan; Alan J. Heeger, all of Santa Barbara, CA (US)

(73) Assignee: Uniax Corporation, Santa Barbara, CA (US)

( * ) Notice: Subject to any disclaimer, the term of this patent is extended or adjusted under 35 U.S.C. 154(b) by 0 days.

(21) Appl. No.: 09/120,253

(22) Filed: Jul. 21, 1998

Related U.S. Application Data
(60) Provisional application No. 60/053,572, filed on Jul. 21, 1997.

(51) Int. Cl.[7] ...................... H01L 31/0256; H01L 35/24; H01L 27/00
(52) U.S. Cl. ............................ 257/443; 257/40; 257/432; 257/294; 250/208.1; 250/221; 250/550
(58) Field of Search ............................ 257/40, 294, 432, 257/443; 250/208.1, 221, 550

(56) References Cited

U.S. PATENT DOCUMENTS

| | | |
|---|---|---|
| 5,130,775 | 7/1992 | Maeda et al. |
| 5,232,631 | 8/1993 | Cao et al. |
| 5,315,100 | 5/1994 | Kobayashi et al. |
| 5,323,208 * | 6/1994 | Fukuda ................................. 355/53 |
| 5,804,836 | 9/1998 | Heeger et al. |

OTHER PUBLICATIONS

Heeger et al. "The Plastic Retina—Image Ehancement Using Polymer Grid Triode Arrays" *Science* (1995) 270:1642.

Masaki et al. "New Architecture Paradigms for Analog VLSI Chips" *Institute of Electrical and Electronic Engineers* (1995) 353–375.

"Smart Focal Plane Arrays Offer High–Sensitivity Image Processing" *R& D Magazine* (Aug. 1997) 41.

Mahowald et al. "The Silicon Retina" *Scientific American* (May 1991) 76–82.

Boahen et al. "A Contrast Sensitive Silicon Retina with Reciprocal Synapses" *Advances in Neural Information Processing Systems* (1992) 4:764–772 ( as reprinted).

* cited by examiner

*Primary Examiner*—Jerome Jackson, Jr.

(57) ABSTRACT

Thin film spatial filters are disclosed. The filters are constructed with a continuous thin film of low resistance conductor (for example with a resistance of from $10^{-2}$ to $10^{8}$ Ohms-cm) with plurabilty of resistive elements defining pixels. A thin film of high resistance material is on other side of the pixels in the case of grounded filters. The conductor film provides lateral blurring for image processing.

18 Claims, 29 Drawing Sheets

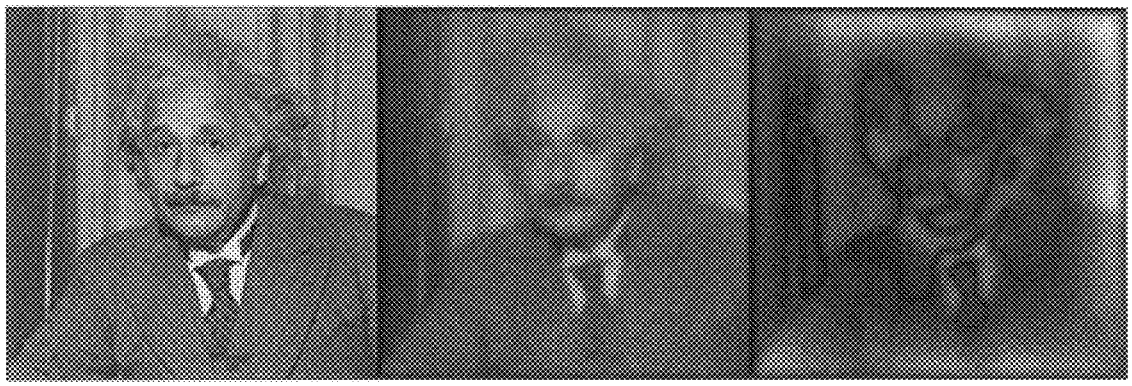
FIG. 10A        FIG. 10B        FIG. 10C
FIG. 11A        FIG. 11B
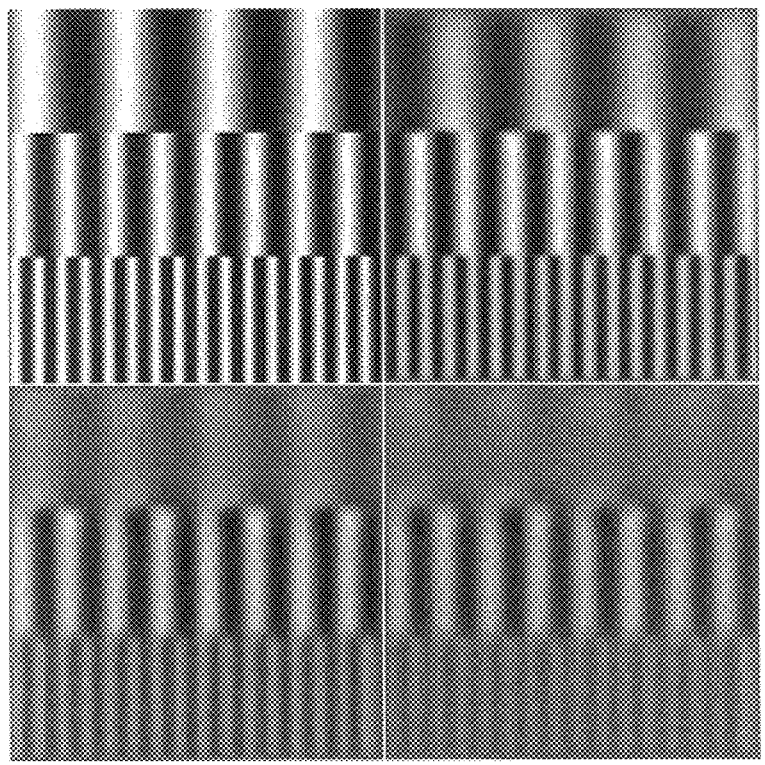
FIG. 11C        FIG. 11D FIG. 42A
FIG. 42B
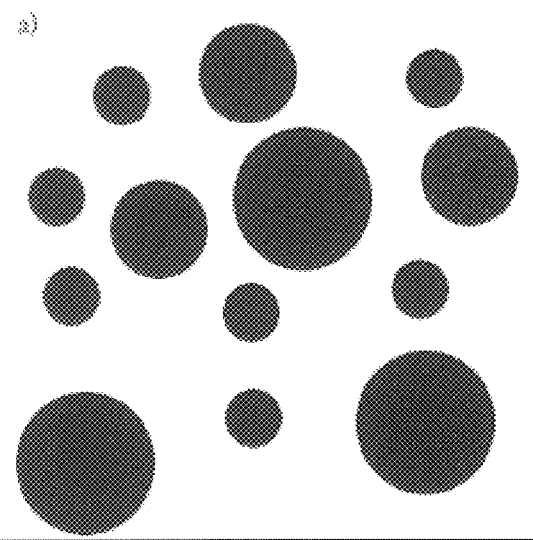
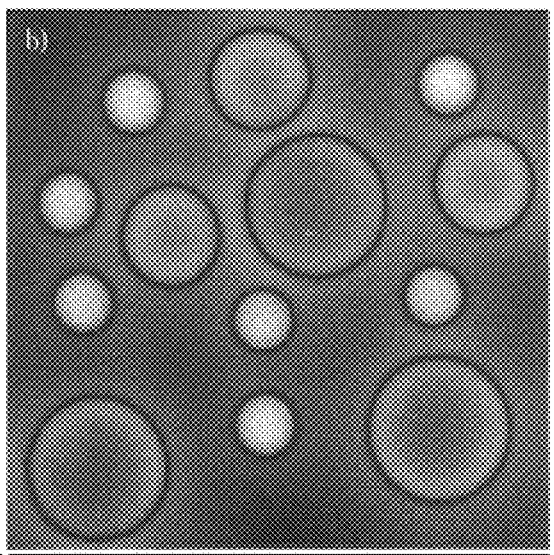
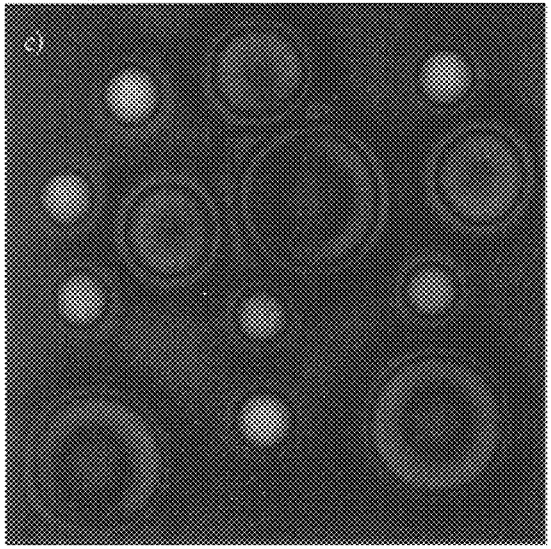
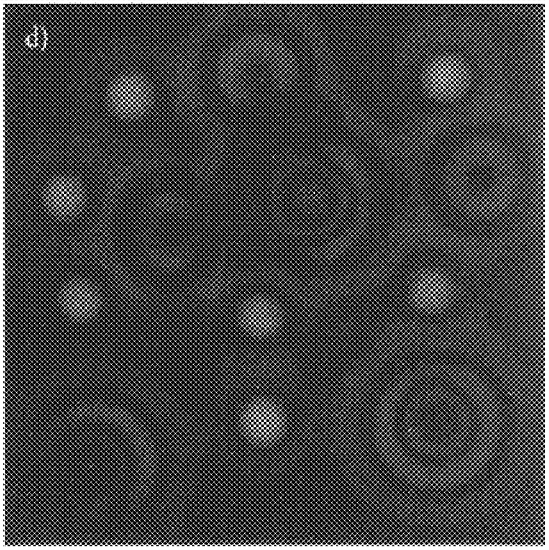
FIG. 42C
FIG. 42D

THIN FILM SPATIAL FILTERS

This application claims benefit to U.S. Provisional Application 60/053572 filed Jul. 21, 1997.

FIELD OF THE INVENTION

This invention relates to solid state electronic devices. More particularly, it concerns thin film spatial filters made from organic or inorganic semiconductors or conductors which function as an active resistive network and find utility as spatial frequency filters to provide background suppression and local contrast gain control.

BACKGROUND OF THE INVENTION

Spatial frequency filtering is essential to a variety of image processing applications. Spatial frequency filtering is currently being used for image enhancement in medical imagery, such as in Positron Emission Tomography (PET) and Magnetic Resonance Imaging (MRI), as an aid to detection of cancerous regions. In military applications, spatial frequency filtering is useful in the arena of target detection. In this case, bandpass filtering can be used to isolate features of a given dimension from an image, thus facilitating greatly the target detection algorithms.

Two of the existing methods for achieving spatial frequency filtering of images are computer software and analog discrete circuit implementations; both have significant drawbacks.

For the digital software approach, even a simple algorithm which produces "blurring" (low pass spatial frequency filtering) of an image can take up to several minutes to calculate, and is strongly dependent on the resolution of the image. For example, for a standard 1024×1024 grayscale image, a Gaussian blur of 20 pixels would take approximately 30 seconds using a standard Pentium computer; for higher resolution images with full color capability, this operation would take much longer. The power consumption for these systems is relatively high, with a standard desktop computer consuming in excess of 75 Watts.

Spatial frequency filtering has also been implemented [C. M. Mead, *Analog VLSI and Neural Systems*, 1989] in the analog domain using digital circuits comprising discrete circuits comprising field effect transistors (FETs). This method was shown to be effective for achieving local contrast control (high pass spatial frequency filtering). However, the discrete circuit approach has two fundamental drawbacks.

First, the lateral conductance between pixels is emulated by a complicated multiple FET circuit, which requires a large unit cell area ("real estate") for each pixel; typically dimensions of nearly 100 $\mu$m×100 $\mu$m are required. Because there is such a large real estate demand for this implementation, large format arrays (e.g. 1024×1024) cannot be fabricated, since the resultant array would have dimensions of 10 cm×10 cm. Current semiconductor processing techniques are not compatible with devices larger than 2 cm.

Second, like the computational algorithmic approaches to spatial frequency filtering, the discrete FET implementation also has a slow time response (~100 msec), in addition to large power requirements (>20W for a 1024×1024), both of which are incompatible with real time remote sensing applications which require sub-millisecond response with sub-Watt power consumption.

STATEMENT OF THE INVENTION

The present invention provides thin film spatial filters (TF Spatial Filters). This type of device, made from layers of thin film conductors (either conducting polymers, organic conductors, or inorganic conductors or semiconductors), functions as an active resistive network. The nondelineated conducting layer(s) provide spatial frequency filtering including background suppression and local contrast gain control. A single device with simple user adjustment can function as either a high pass or low pass spatial frequency filter with frame to frame agility. Any admixture of the filtering action by a linear combination with the original image is likewise easily controlled and implemented. The simplifications in the device architecture enable a super-architecture of image processors that can perform a variety of complex functions. By combining several devices operated individually as high and low pass spatial filters with different blurring lengths (spatial frequency roll-off), an agile band pass spatial filter of any selected width can be constructed.

A non-delineated array constructed from either conducting polymers or inorganic semiconductors offers both fabrication advantages and a significant saving of "real estate" within the unit cell of each pixel compared to the discrete approach implemented in conventional VLSI silicon technology [as described, for example, by C. M. Mead, *Analog VLSI and Neural Systems*, 1989]. This is especially true in situations where temporal signatures are to be analyzed over the entire focal plane, thereby eliminating a digital approach to lateral interaction.

It is accordingly an object of the present invention to provide Thin Film Spatial Filters which are useful as spatial frequency filters.

It is additionally an object of the present invention to provide Thin Film Spatial Filters which are useful as low pass spatial frequency filters.

It is additionally an object of the present invention to provide Thin Film Spatial Filters which are useful as high pass spatial frequency filters. It is additionally an object of the present invention to provide Thin Film Spatial Filters which are useful as band pass spatial frequency filters.

It is additionally an object of the present invention to provide a means by which the spatial decay length (or blurring length) can be controlled.

It is additionally an object of the present invention to utilize the processing advantages associated with the fabrication of the conducting layer(s) of the TF Spatial Filter from soluble organic materials such as, for example, conducting conjugated polymers (and/or their precursor polymers), cast from solution to enable the fabrication of large active areas. Examples of conducting polymers that are processable from solution include, but are not limited to polyaniline (emeraldine salt form) and doped poly(ethylenedioxythiophene).

It is additionally an object of the present invention to utilize inorganic materials for the conducting layer(s) of the TF Spatial Filter. Examples include, but are not limited to indium/tin-oxide, amorphous silicon and amorphous carbon.

DETAILED DESCRIPTION OF THE INVENTION

The detailed description includes the following sections:
Brief description of the Drawings
Description of the Preferred Embodiments
Examples

BRIEF DESCRIPTION OF THE DRAWINGS

This invention will be further described with reference being made to the drawings.

FIG. 1A is the TF Spatial Filter structure 10 for use in applications where the device must be grounded. In this case, the blurring is accomplished by a conducting bilayer. The top layer 12 comprises a low resistivity conductor material ($r_p$), which provides the lateral blurring required for image processing applications. The bottom layer 4 comprises a high resistivity layer ($r_b$) which prevents the top layer from shorting to ground 8.

FIG. 1B shows an example TF Spatial Filter structure 106 for use in applications where the device is floating (not grounded). In this case, the blurring is accomplished by a single conducting layer 8 which comprises a low resistivity material ($r_p$), which provides the lateral blurring required for image processing applications.

In both 1A and 1B, the variable input resistors 6a, 6b, 6c, etc., one in each pixel, are ganged together to provide user tunability of the blurring length of the device (see Equation 1).

Figure 2:
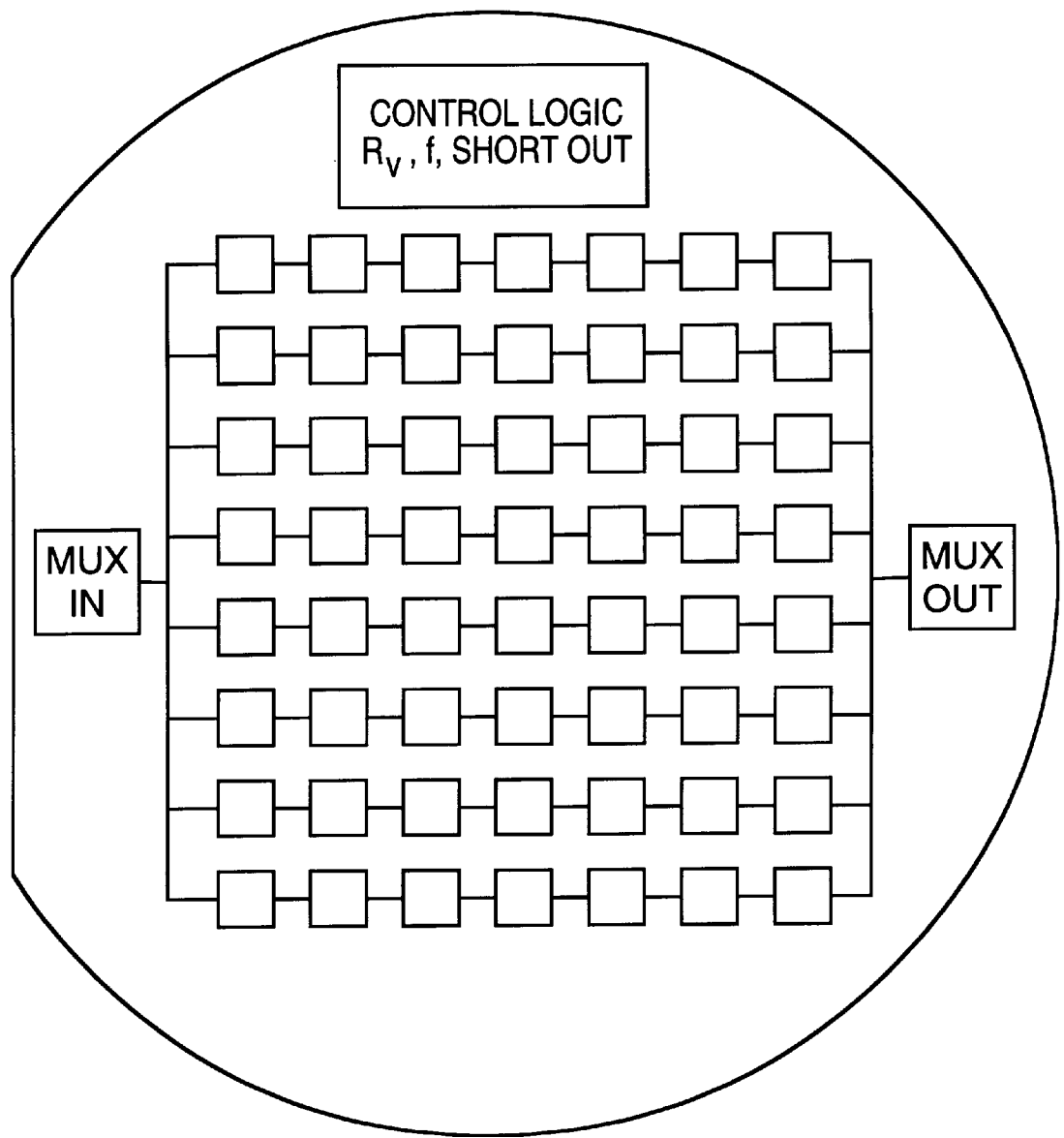

FIG. 2 is a schematic of analog spatial frequency filtering by non-delineated resistive grids in wafer scale integration. The vertical axis corresponds to a particular frequency band, and the horizontal axis refers to the order of the multipole of that spectral band (i.e. the sharpness).

Figure 3:
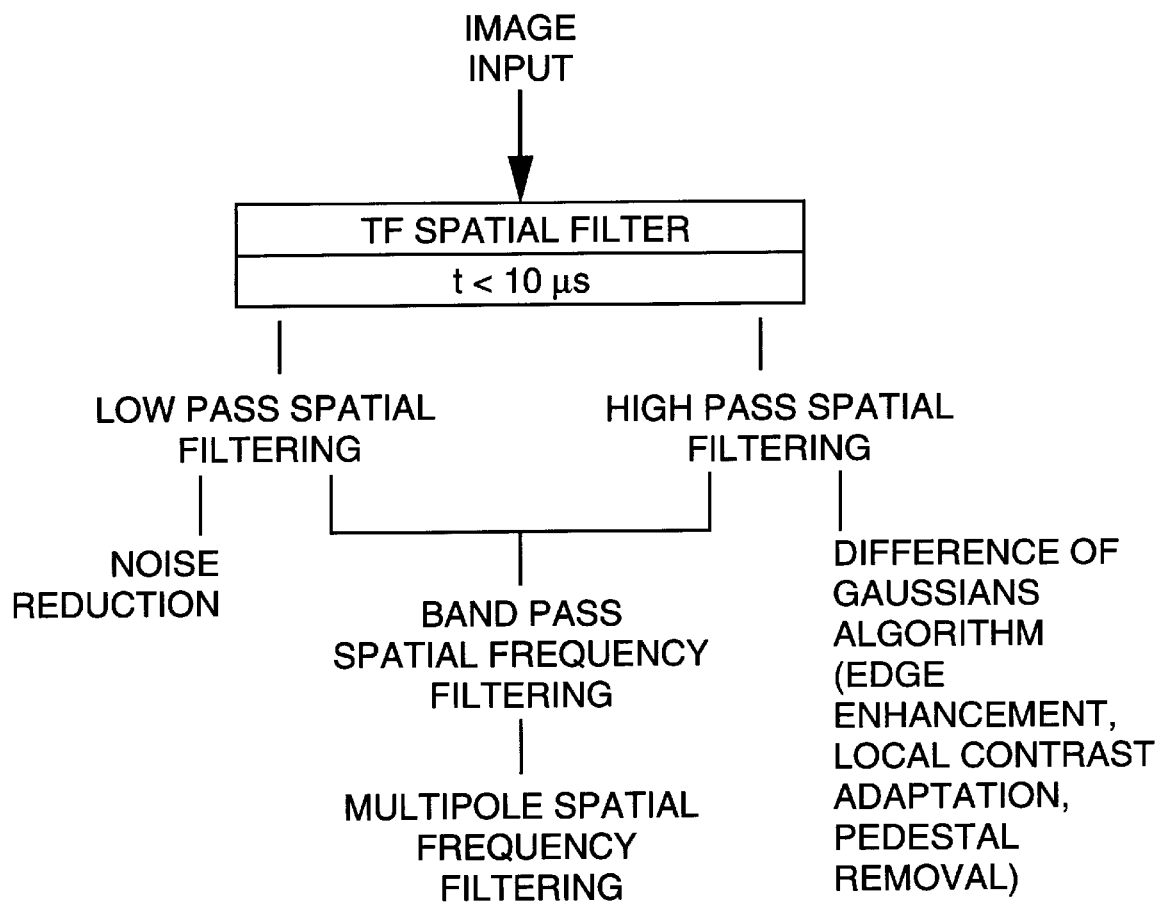

FIG. 3 is a schematic of multifunctional operation of the Thin Film Spatial Filter.

Figures 4A, 4B, 4C:
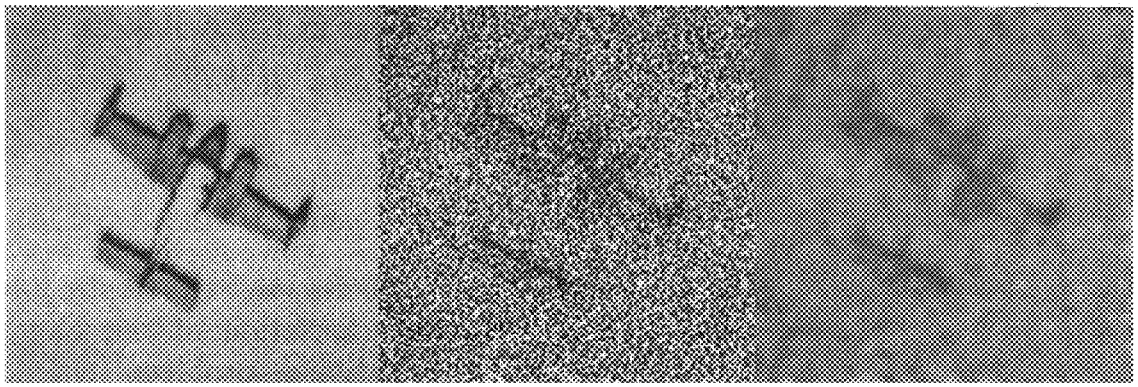

FIGS. 4A, 4B and 4C are a pictoral demonstration of noise reduction utility of low pass spatial frequency filter.

Figure 5:
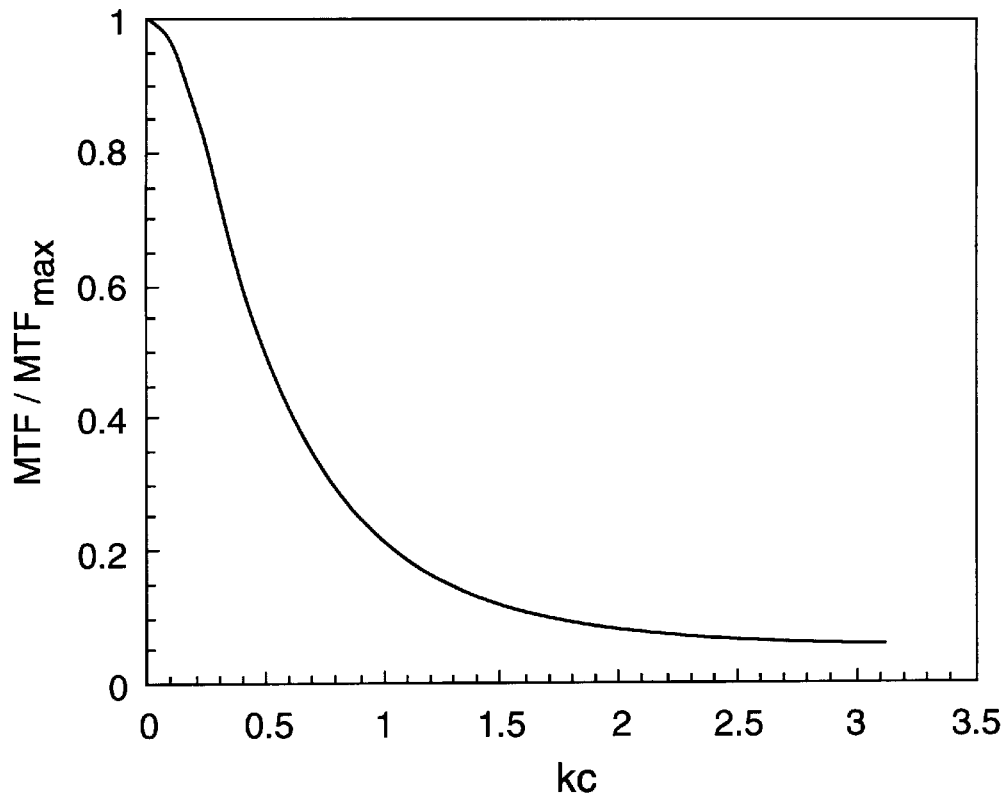

FIG. 5 is an example MTF curve for a low pass filter where k is the spatial frequency, and c is an arbitrary normalizing constant.

Figures 6A, 6B:
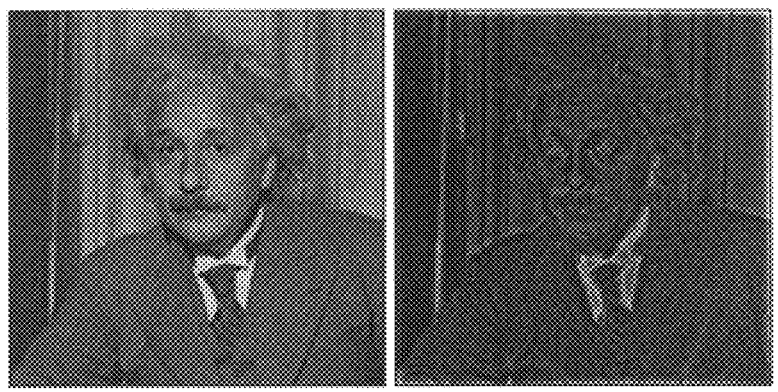

FIGS. 6A and 6B depict an original image (6A) and the same image subjected to high pass filtering (6B).

Figure 7:
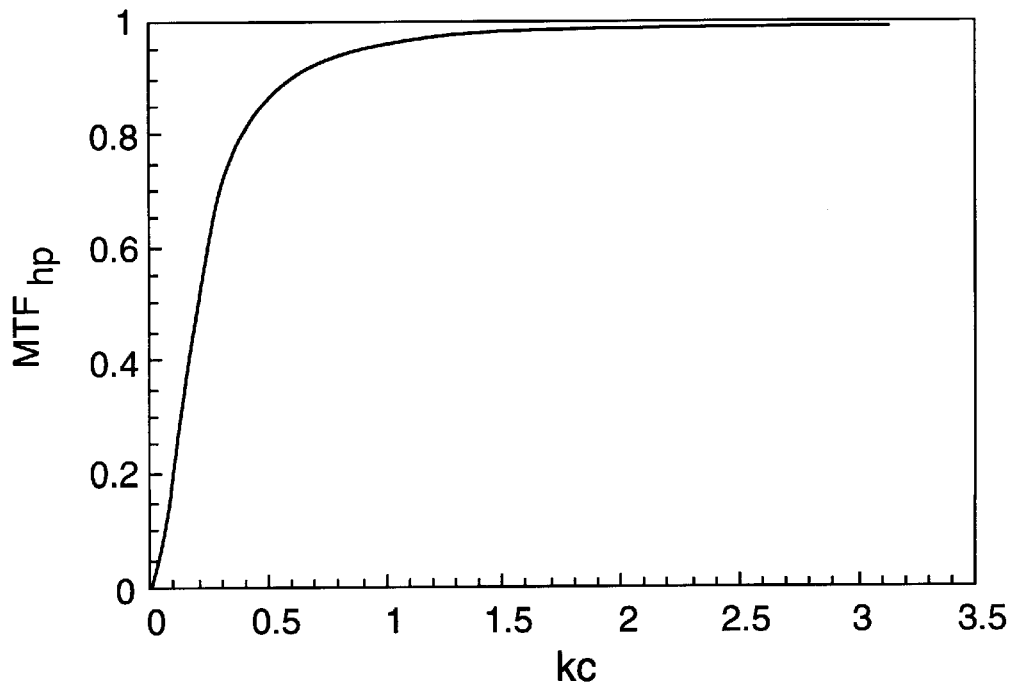
Figure 8A:
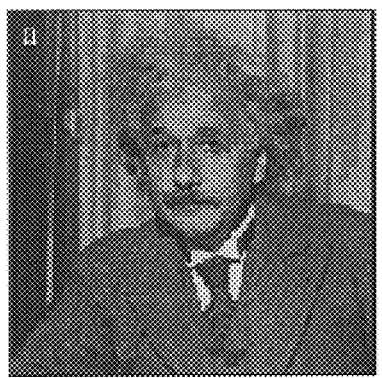
Figure 8B:
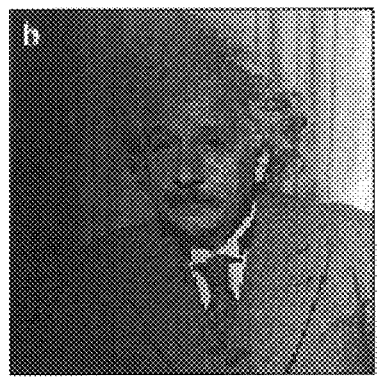
Figure 8C:
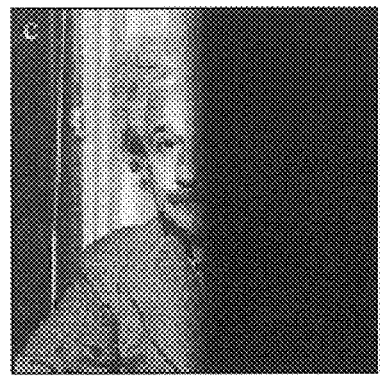
Figure 8D:
Figure 8E:

FIG. 7 is a graph of the MTF curve for a high pass filter.

FIGS. 8A, 8B, 8C, 8D and 8E show a demonstration of D.C. pedestal removal when using low pass filtering in conjunction with logarithmic compression: 8A is the original image; 8B is the original image multiplied by a continuous ramp function; 8C is the original image multiplied by a non-abrupt step function; 8D is the image of 8B after application of the Mead algorithm; and 8E is the image of 8C after application of the Mead algorithm.

Figure 9:
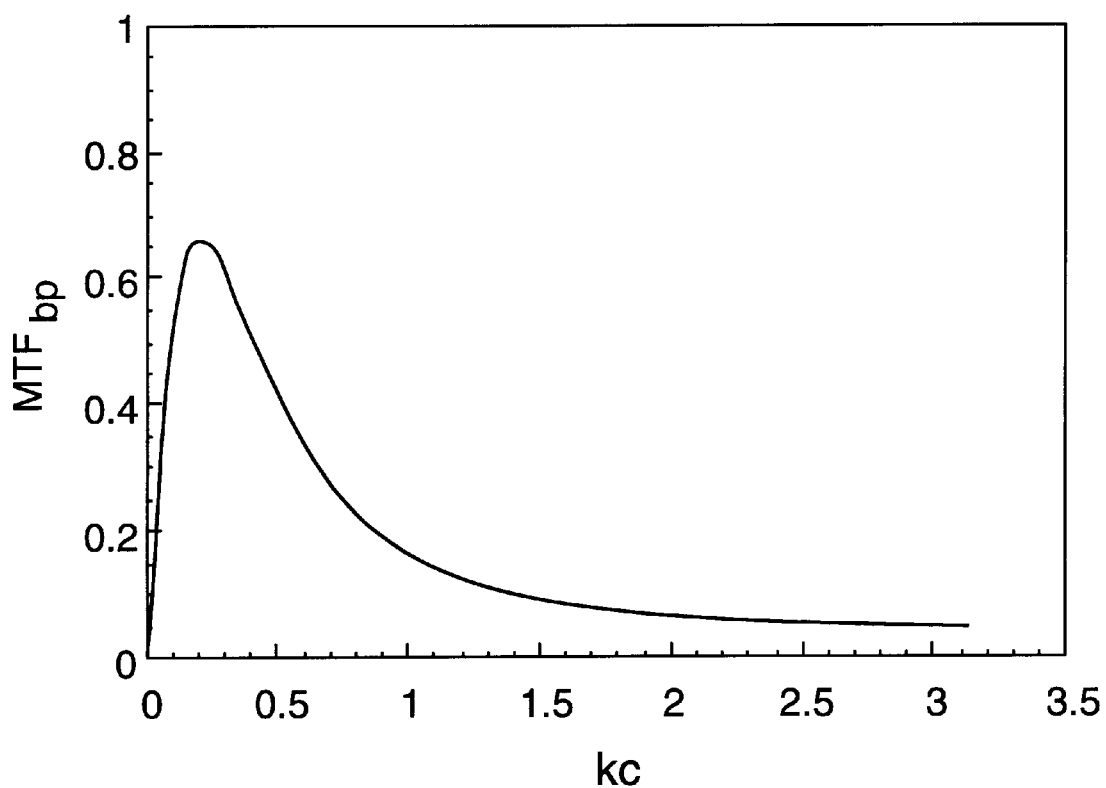

FIG. 9 is a graphic example of a band pass MTF curve obtained by combining a low pass and high pass filter.

FIGS. 10A, 10B and 10C depict band pass filtering using high pass and low pass filters in series: 10A is the original image which is first fed into a low pass filter resulting in 10B; 10B output becomes the input of the high pass filter image show in 10C.

FIGS. 11A, 11B, 11C and 11D show frequency selection using multipole filtering. The original image (11A), which consists of three spatial frequencies, is passed through a series of bandpass filters whose center spatial frequency is matched to the medium frequency pattern. After repeated passes through these filters, the low and high frequency patterns are suppressed: 11A is the original image; 11B, m=1 pass; 11C, m=4 passes; 11D, m=6 passes.

Figure 12:
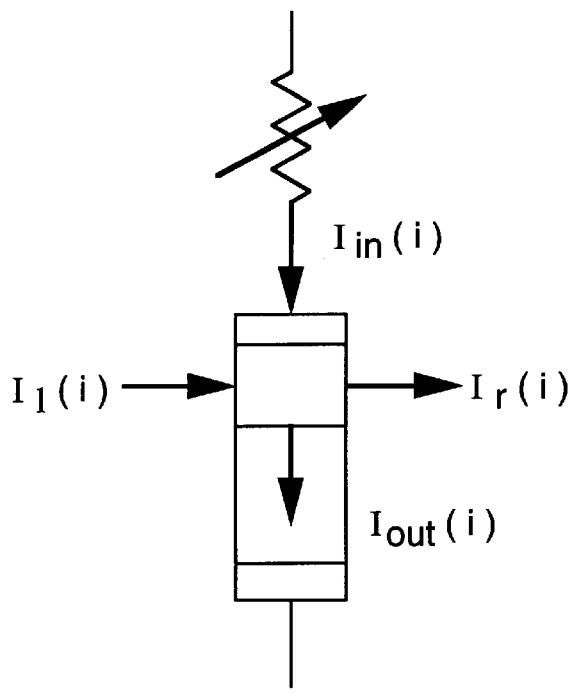

FIG. 12 shows currents contributing to $V_1$ for one possible implementation of the TF Spatial Filter.

Figure 13:
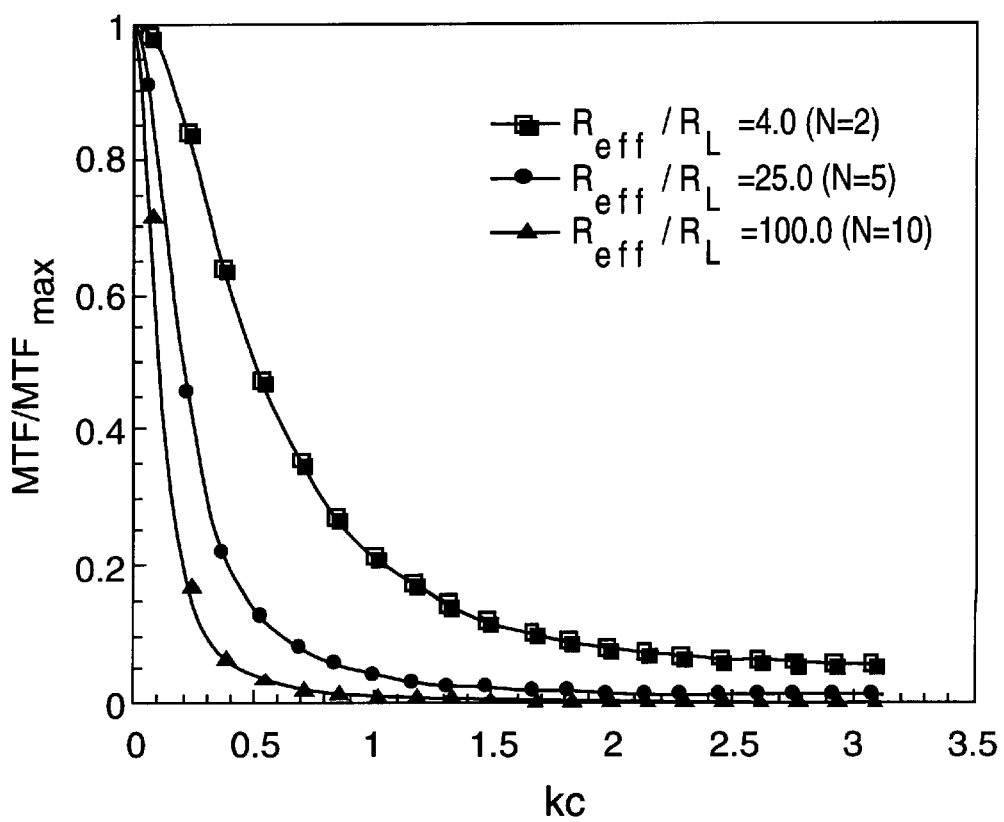

FIG. 13 is a graphic depiction of MTF curves for the output voltage and for various blurring lengths.

Figure 14:
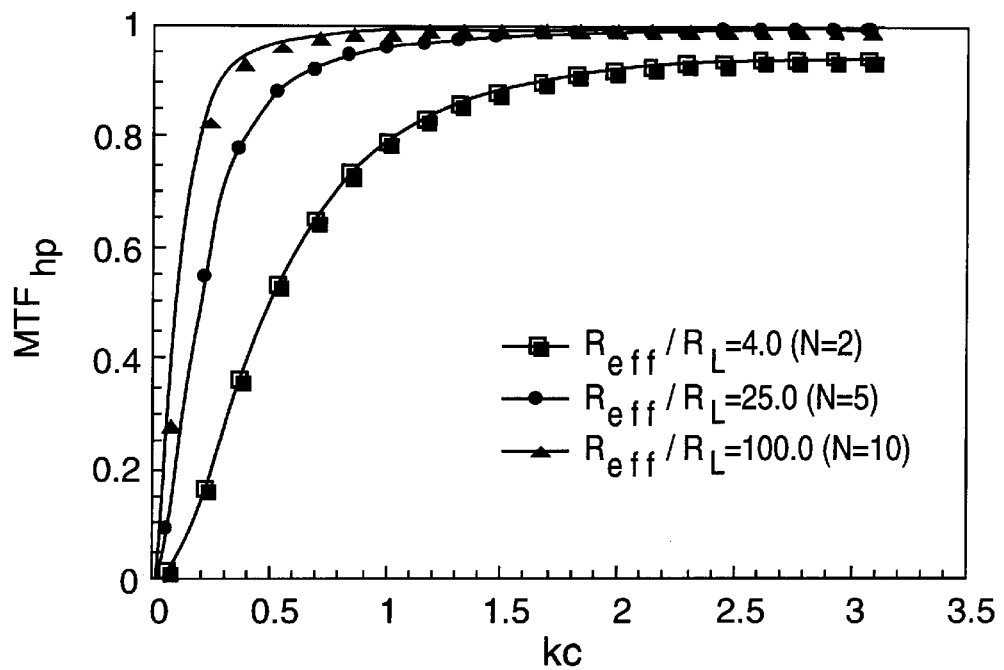

FIG. 14 is a graphic depiction of the MTF curves with the high pass filter implementation of the Thin Film Spatial Filter.

Figure 15:
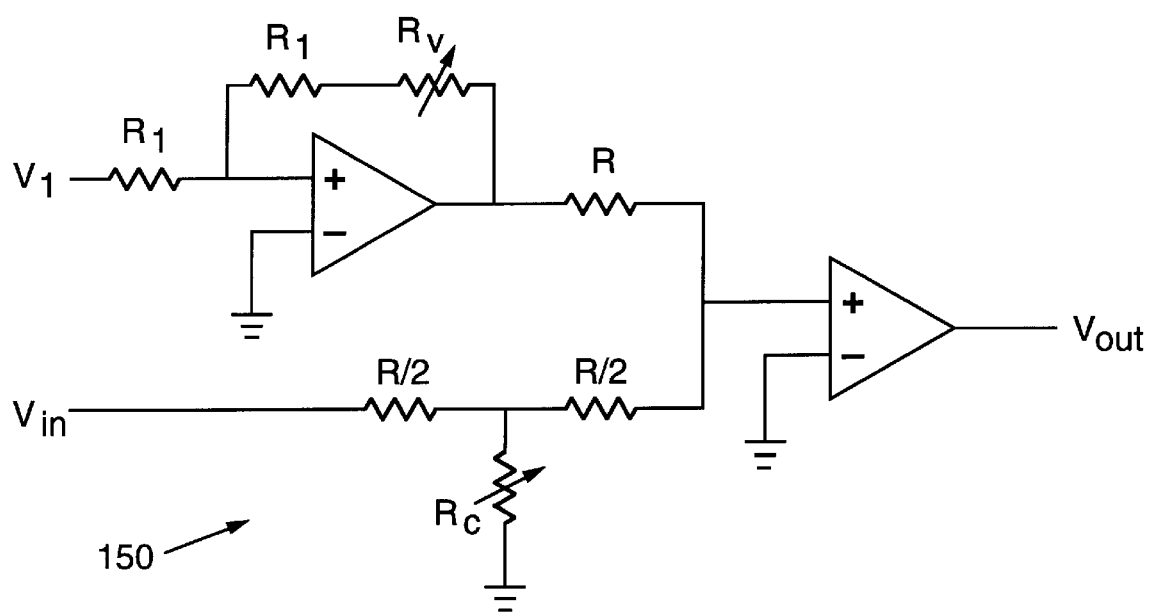

FIG. 15 shows post-processing op amp circuitry for implementation of user control of spatial frequency filtering. $V_1$ and $V_{in}$ are provided from the unit cell outputs, as shown in FIG. 1.

Figure 16:
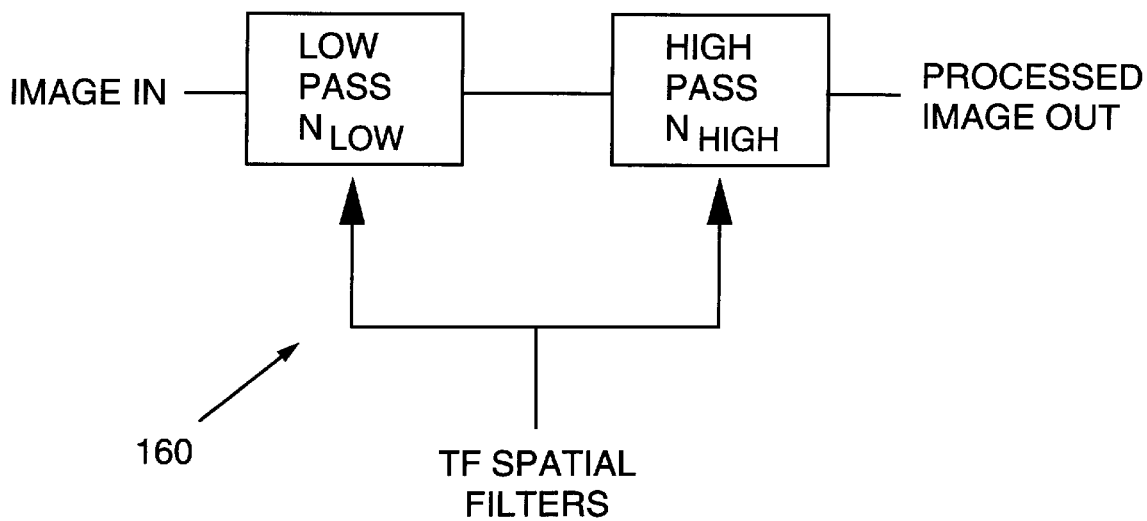

FIG. 16 is a block diagram of band pass filter implementation using the Thin Film Spatial Filter.

Figure 17:
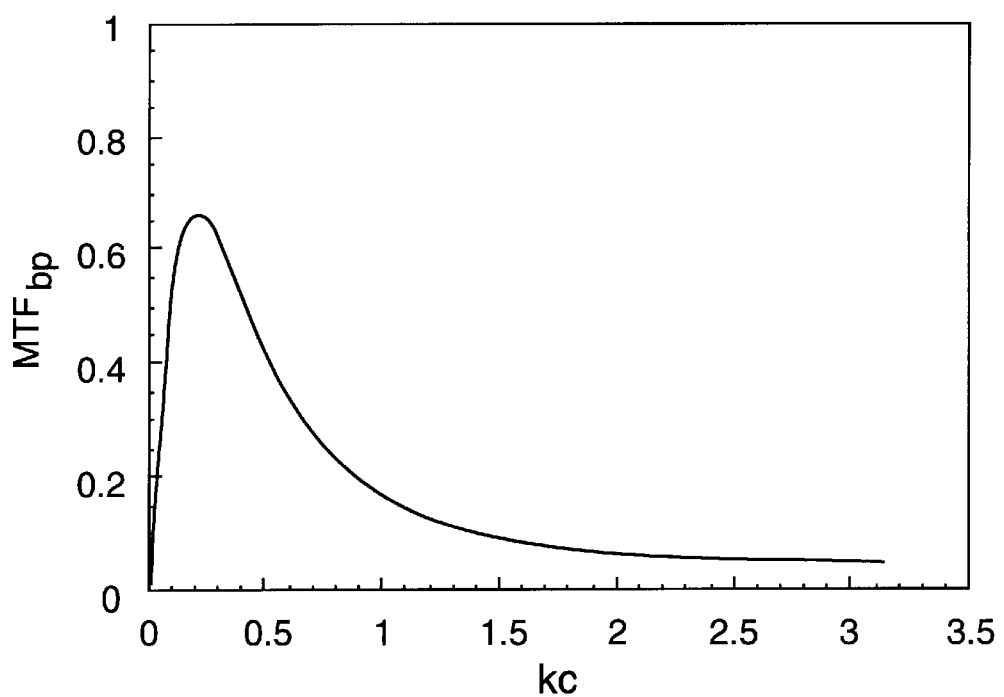

FIG. 17 depicts the MTF curve of a band pass filter using two Thin Film Spatial Filters.

Figure 18:
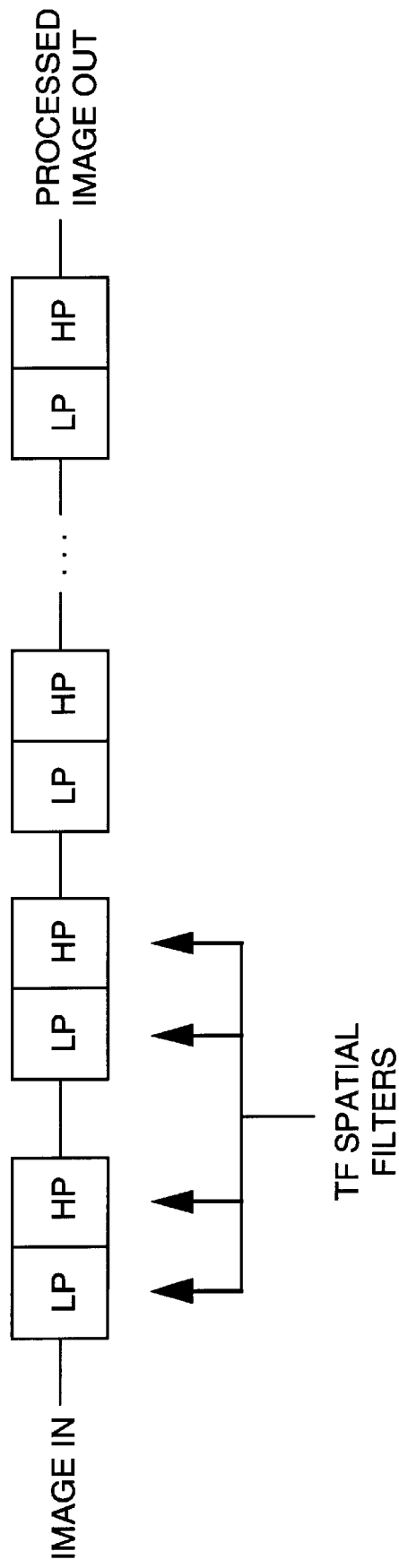

FIG. 18 is a block diagram of construction of a multipole filter using several Thin Film Spatial Filters.

Figure 19:
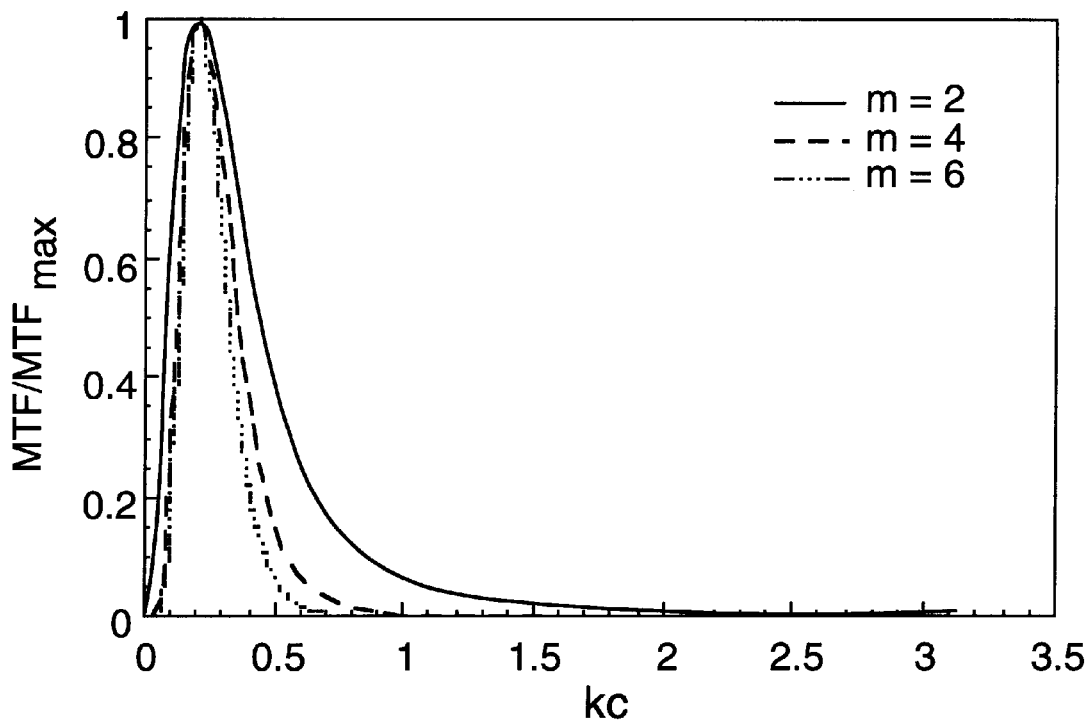

FIG. 19 is a graph of MTF curves of the multipole filter demonstrating the line narrowing of the band pass system.

Figure 20:
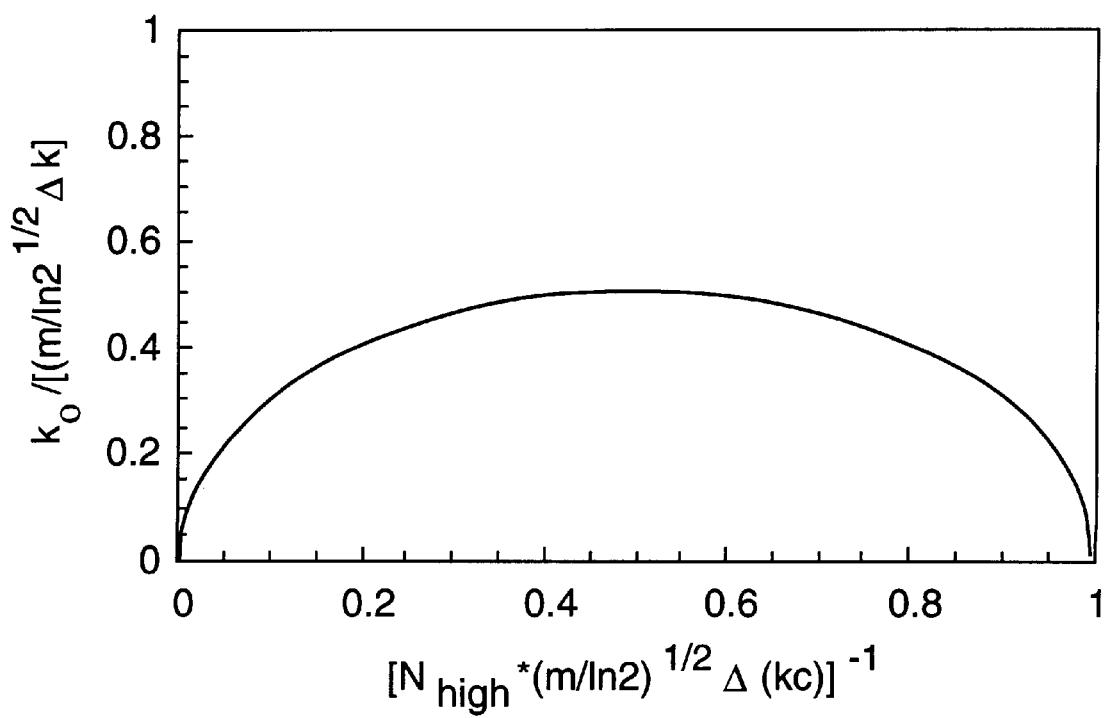

FIG. 20 is a graphic demonstration of tunability of multipole band pass system with a conservation of linewidth.

Figure 21:
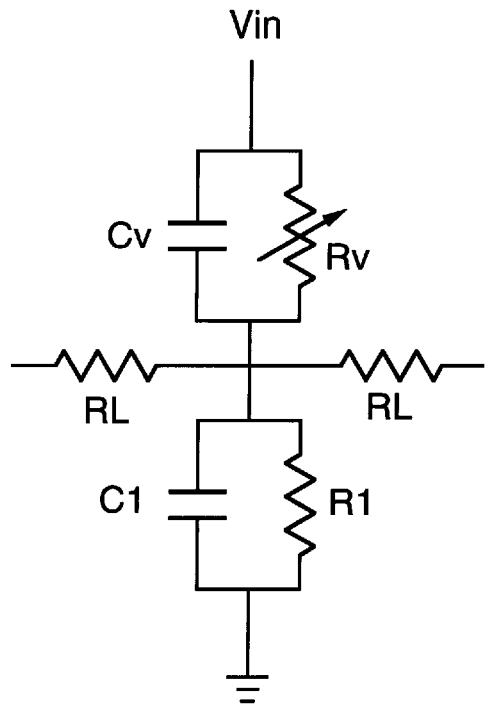

FIG. 21 is the equivalent circuit of an implementation of the Thin Film Spatial Filter, for time response analysis.

Figure 22:
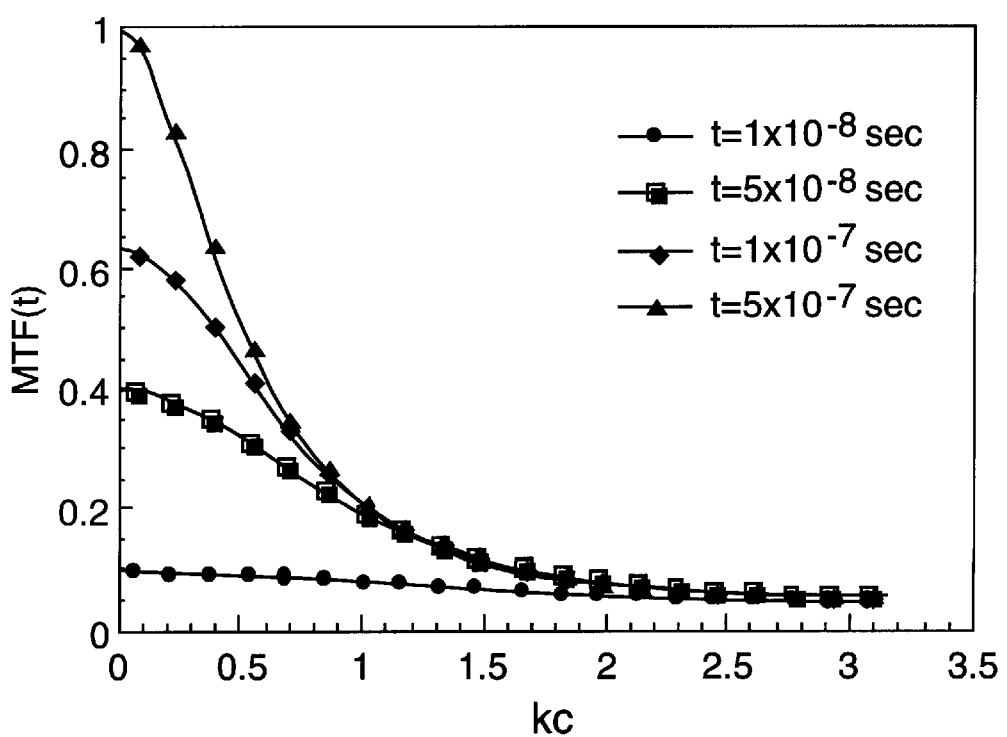

FIG. 22 is a time evolution of the MTF curve, with $(t_{rel})_{max}=1\times10^{-7}$ s.

Figure 23:
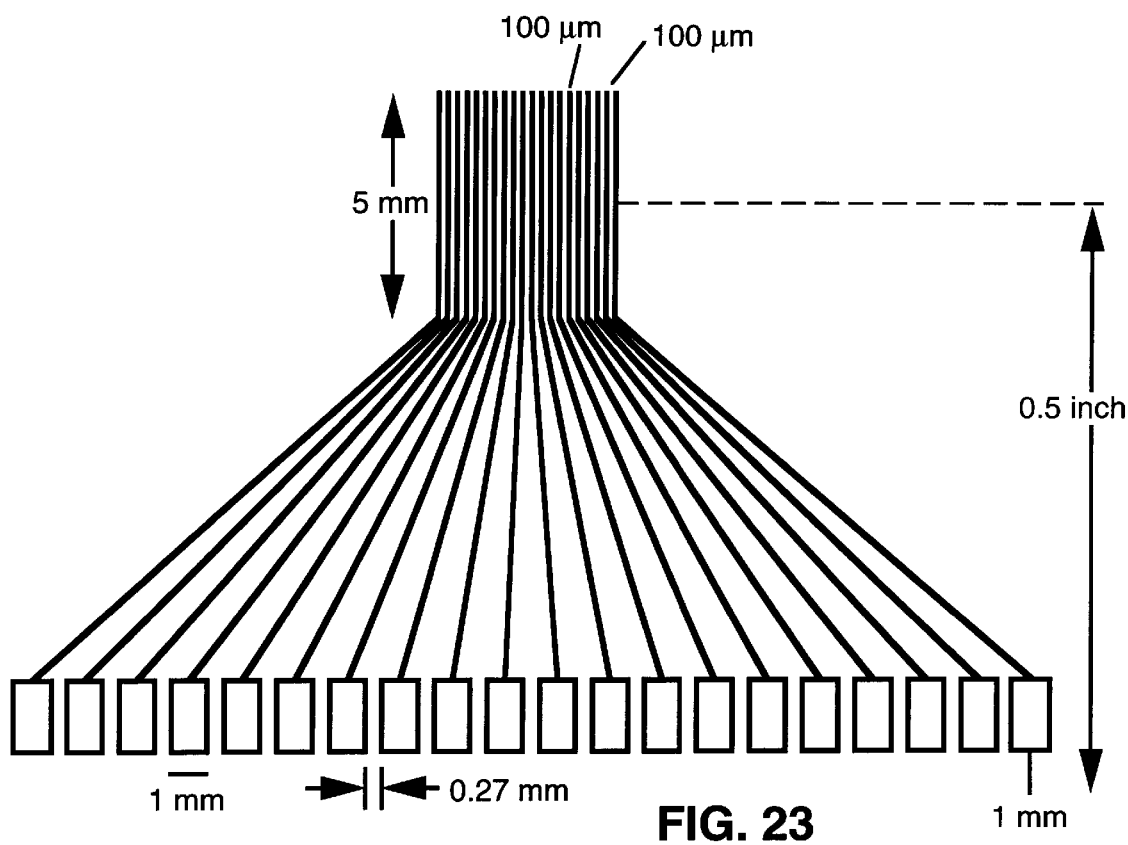

FIG. 23 is a depiction of the shadow mask used for the 1 dimensional TF Spatial Filter fabrication.

Figure 24:
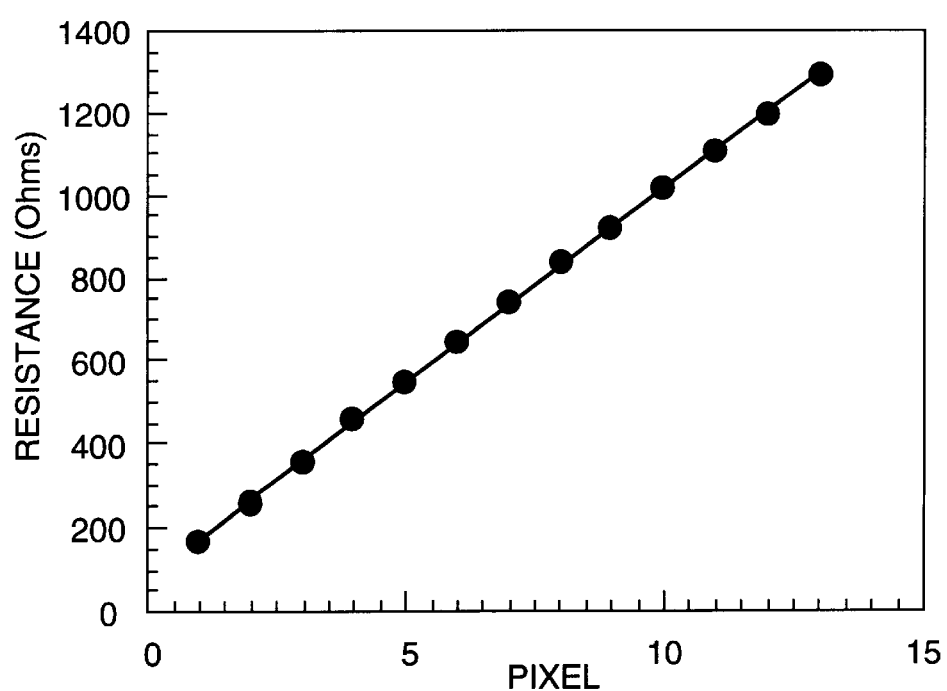

FIG. 24 is a plot of the resistance vs. pixel number for the TF Spatial Filter constructed with conducting PANI.

Figure 25:
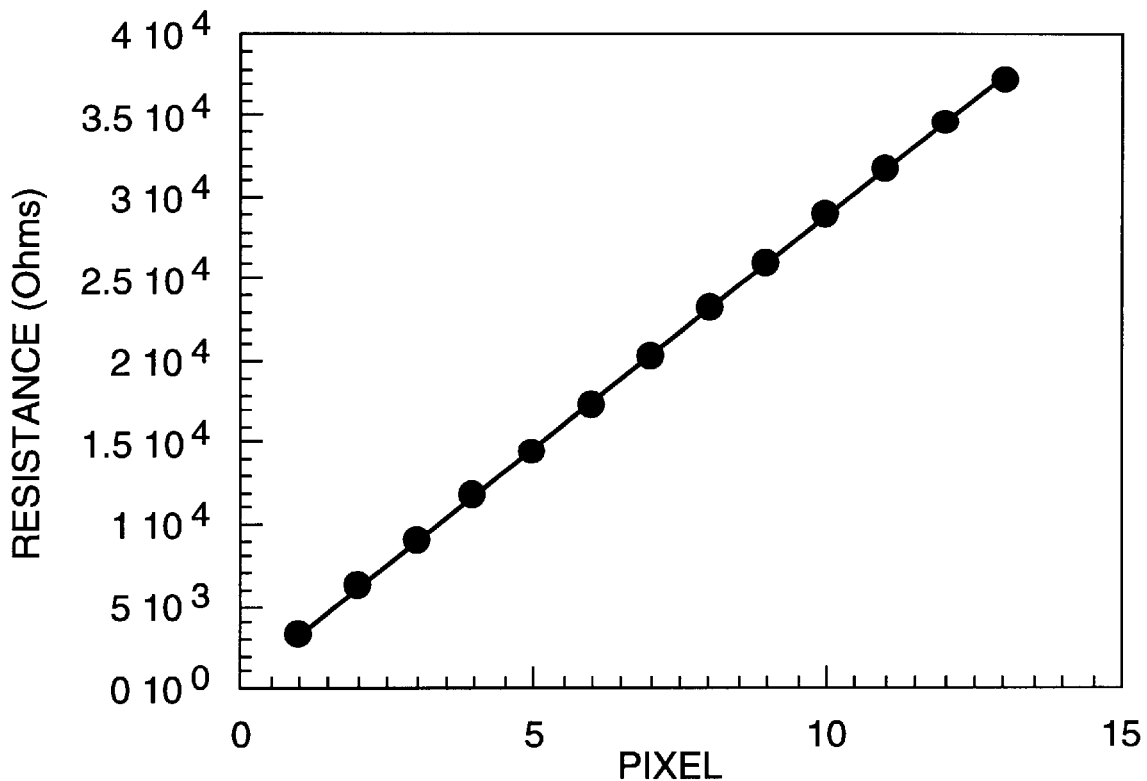

FIG. 25 is a graph of the low pass filter response of the TF Spatial Filter to a step function input, constructed with conducting PANI.

Figure 26:
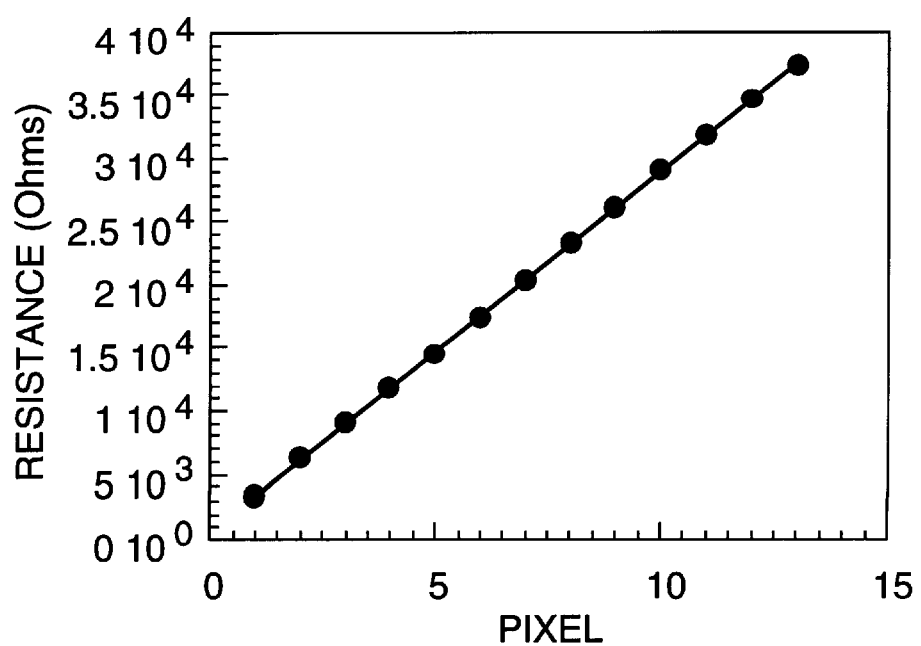

FIG. 26 is a plot of the resistance vs. pixel number for the TF Spatial Filter constructed with conducting PEDOT.

Figure 27:
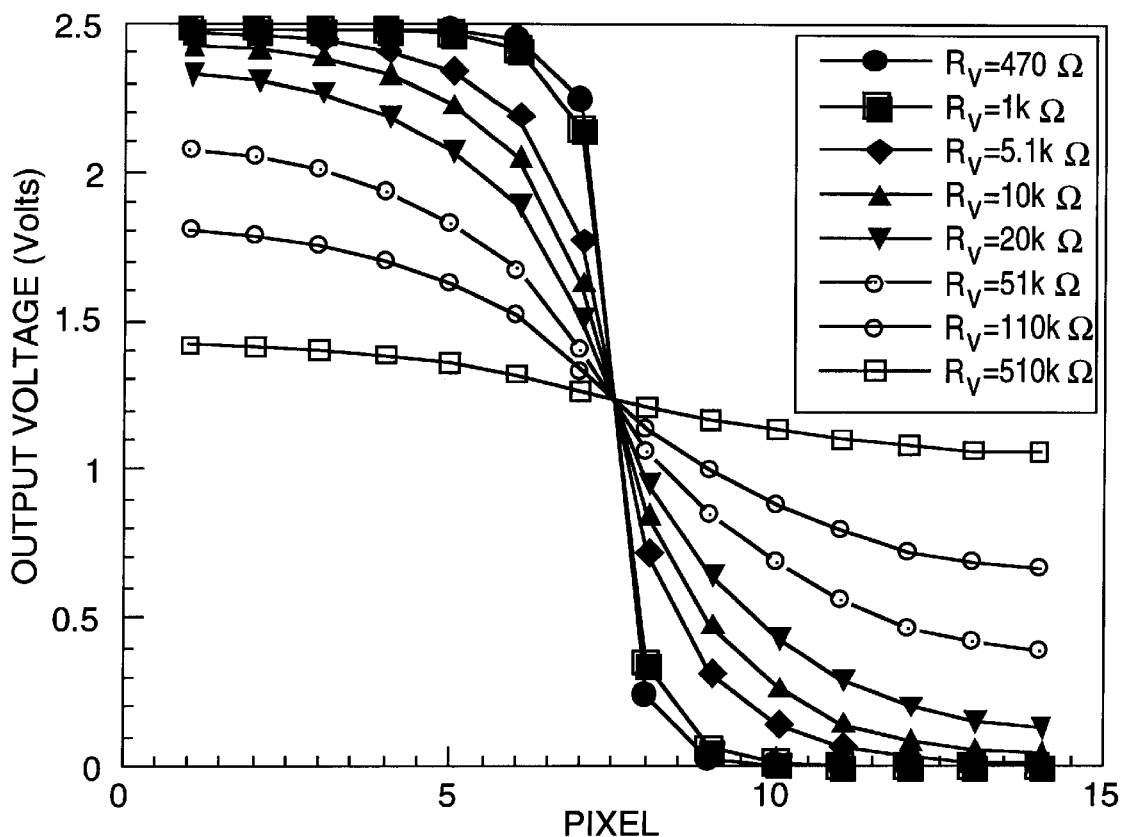

FIG. 27 is a low pass filter response of the TF Spatial Filter to a step function input, constructed with conducting PEDOT.

Figure 28:
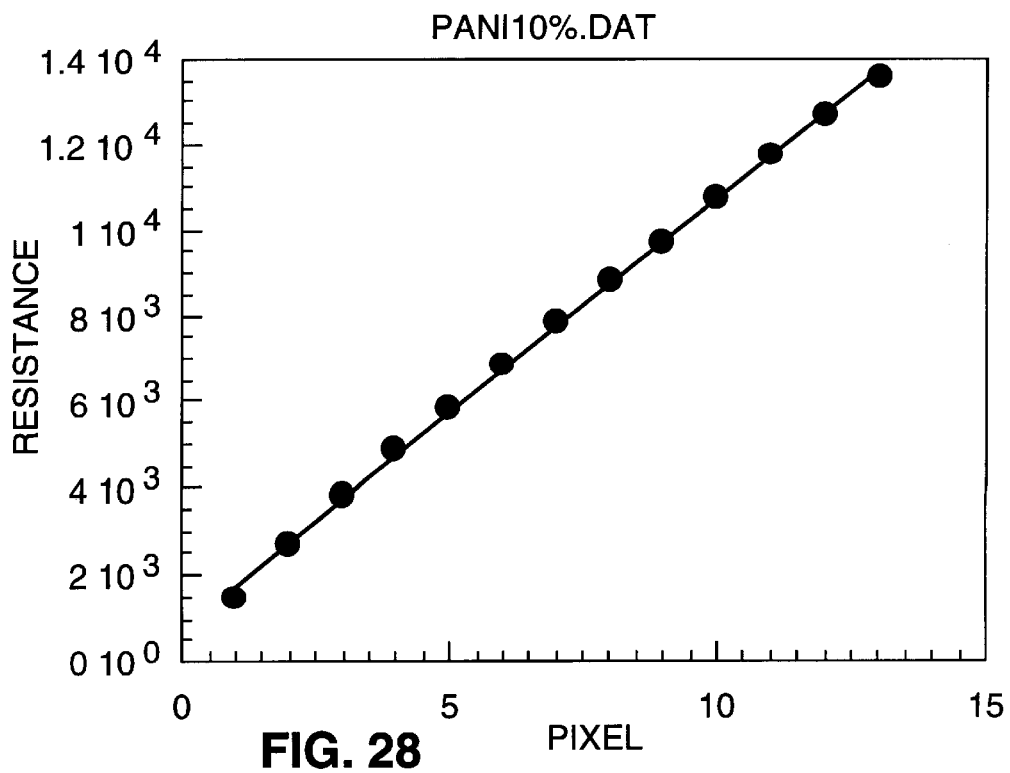

FIG. 28 is a plot of the resistance vs. pixel number for the TF Spatial Filter constructed with a 10% blend of PANI in a PES host.

Figure 29:
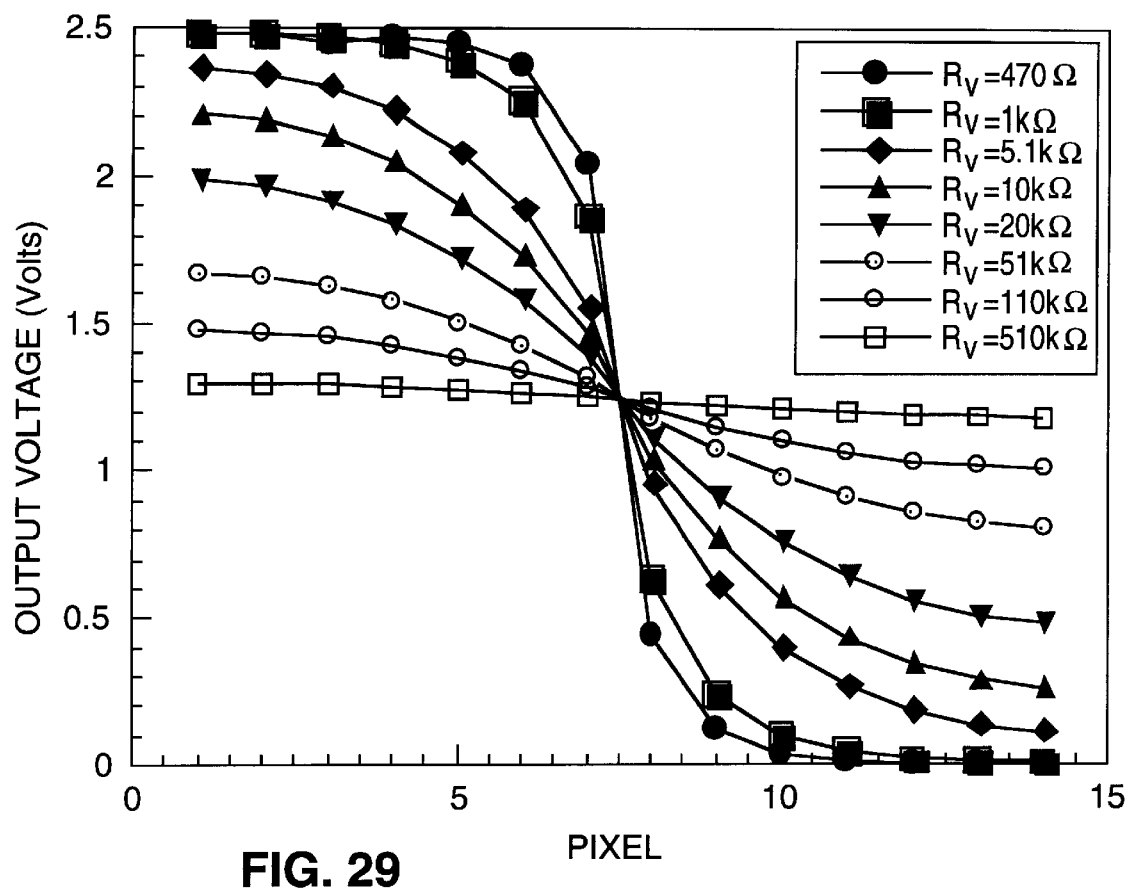

FIG. 29 is a graph of the low pass filter response of the TF Spatial Filter to a step function input, constructed with a 10% blend of PANI in a PES host.

Figure 30:
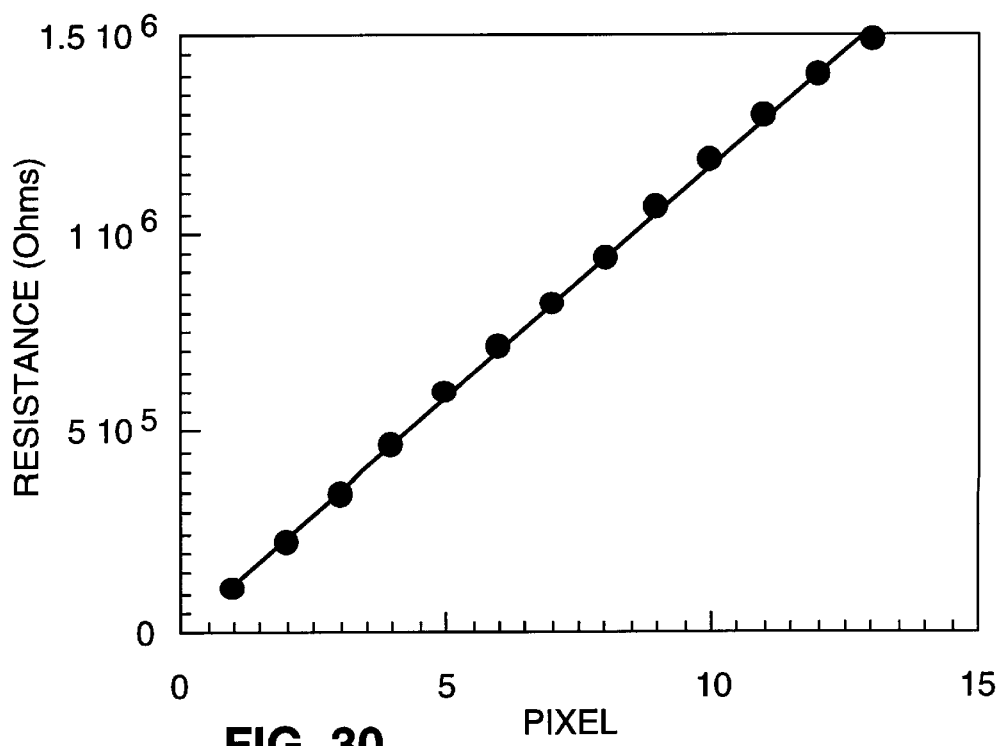

FIG. 30 is a plot of the resistance vs. pixel number for the TF Spatial Filter constructed with a 1% blend of PANI in a PES host.

Figure 31:
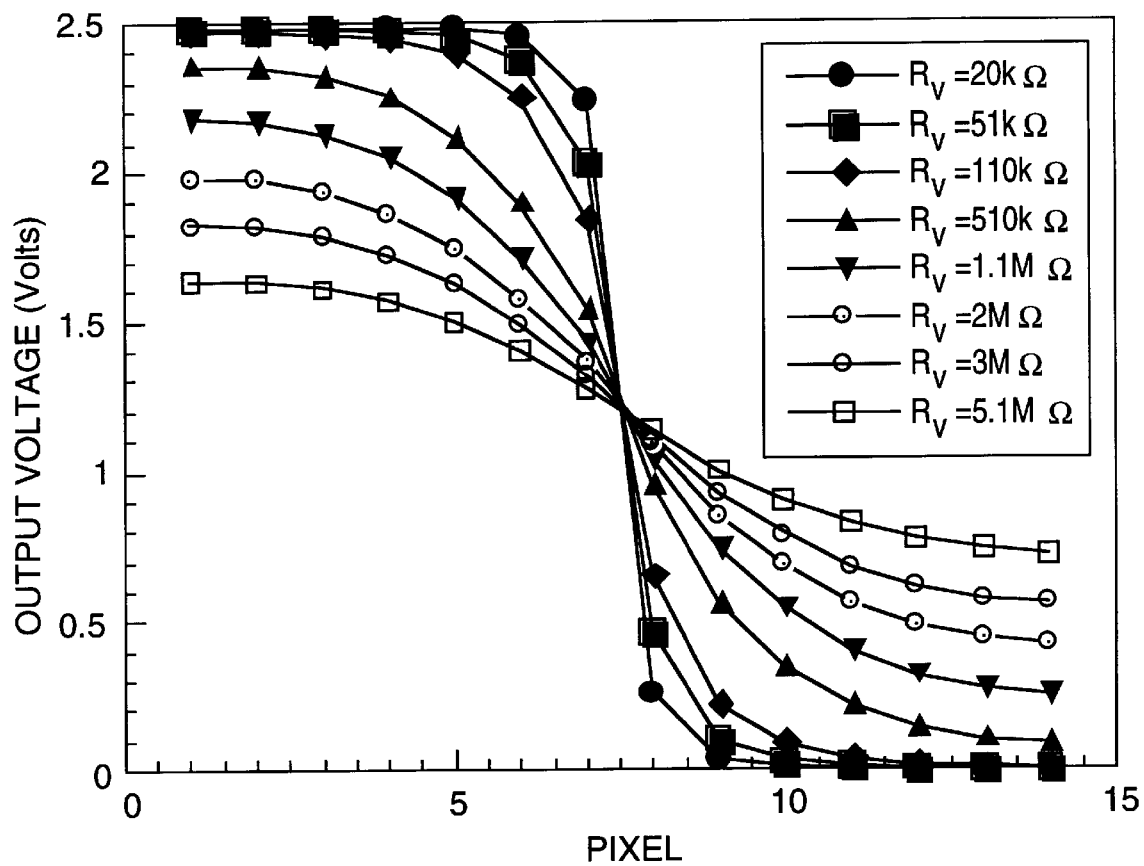

FIG. 31 is a graph of the low pass filter response of the TF Spatial Filter to a step function input, constructed with a 1% blend of PANI in a PES host.

Figure 32:
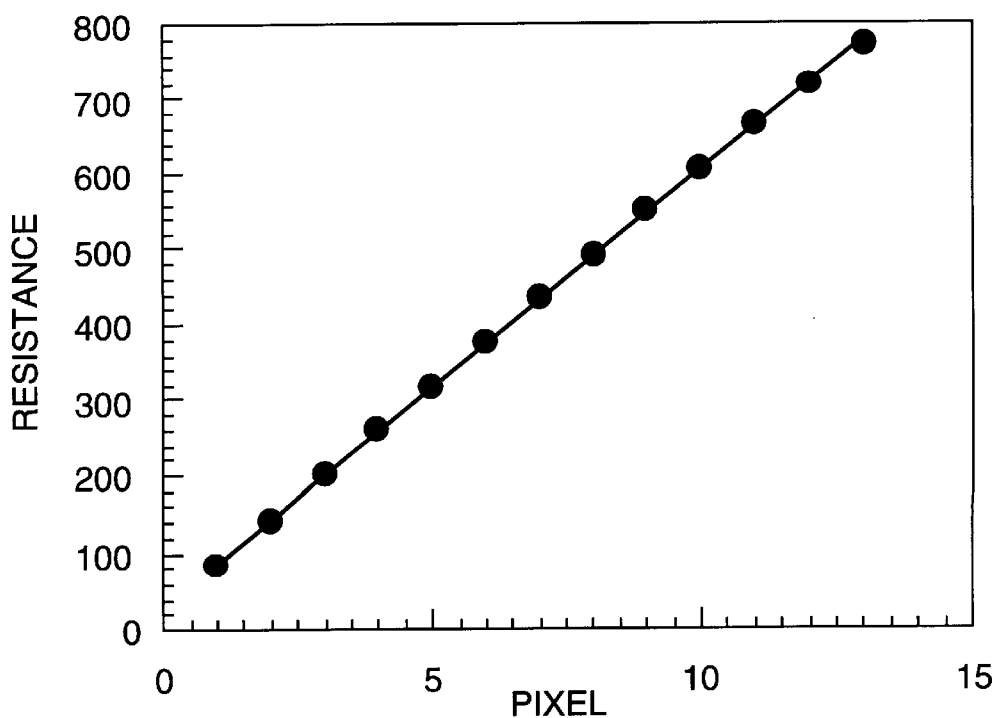

FIG. 32 is a plot of the resistance vs. pixel number for the TF Spatial Filter constructed with indium tin oxide (ITO).

Figure 33:
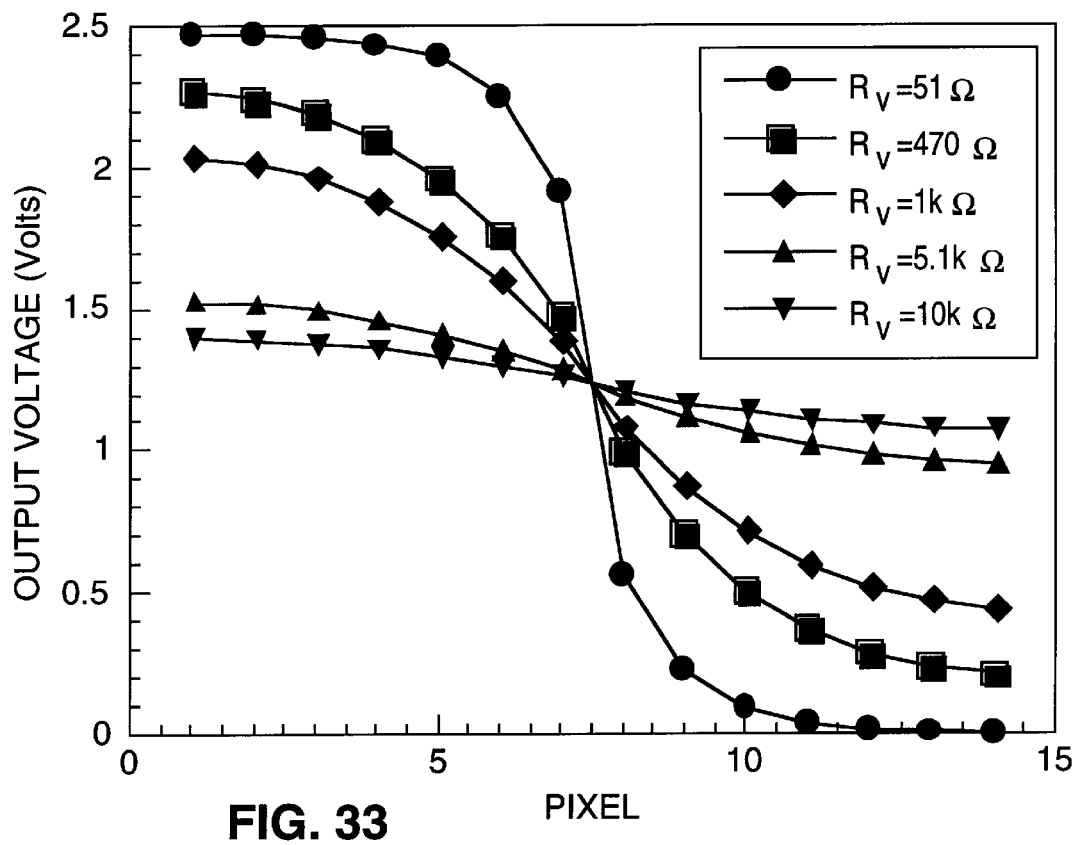

FIG. 33 is a graph of the low pass filter response of the TF Spatial Filter to a step function input, constructed with conducting indium tin oxide (ITO).

Figure 34:
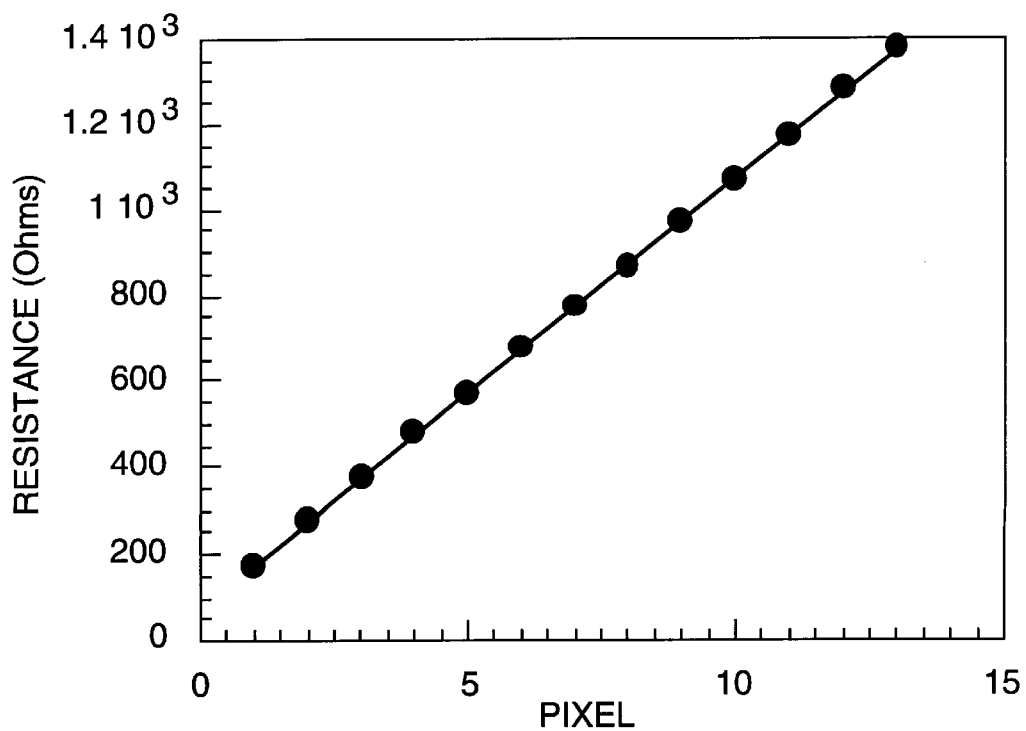

FIG. 34 is a plot of the resistance vs. pixel number for the TF Spatial Filter constructed with doped amorphous silicon.

Figure 35:
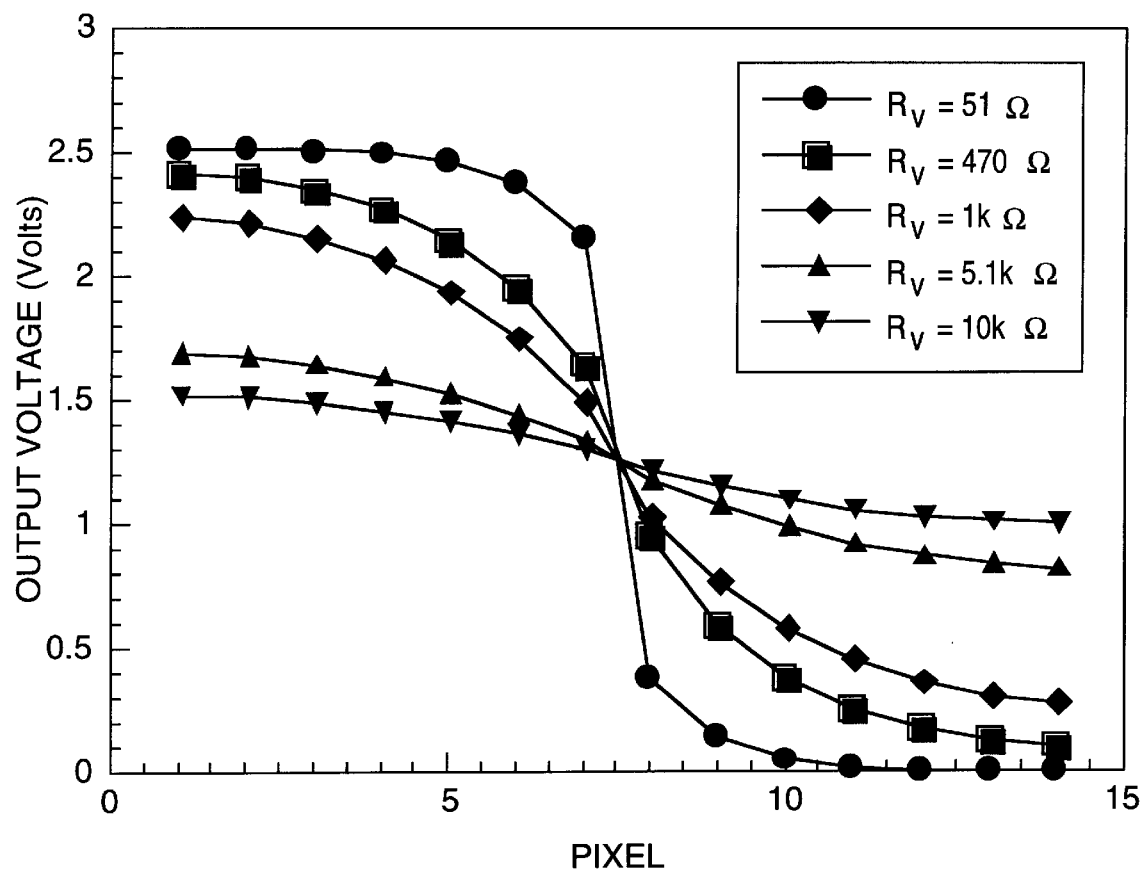

FIG. 35 is a graph of the low pass filter response of the TF Spatial Filter to a step function input, constructed with doped amorphous silicon.

Figure 36:
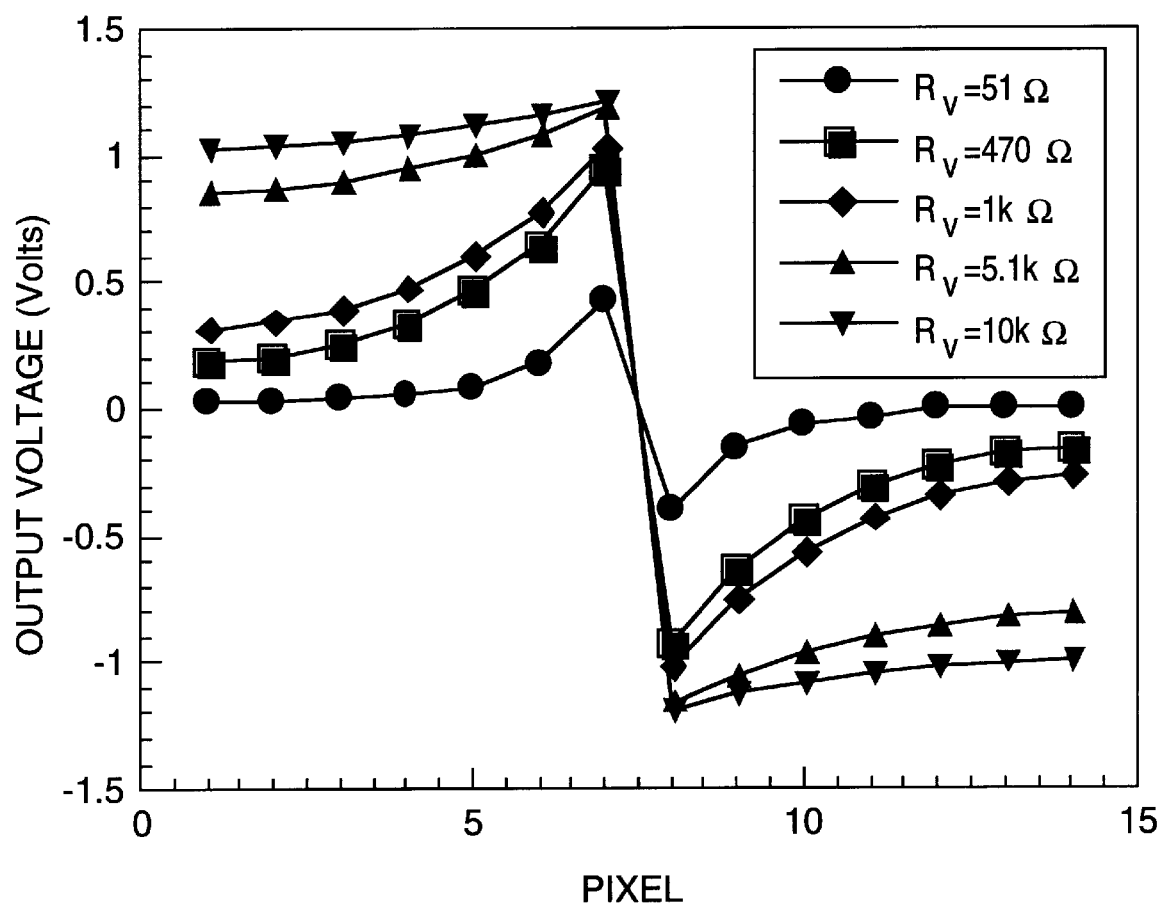

FIG. 36 is a graph of the high pass filter response of the TF Spatial Filter to a step function input, constructed with conducting PANI.

Figure 37:
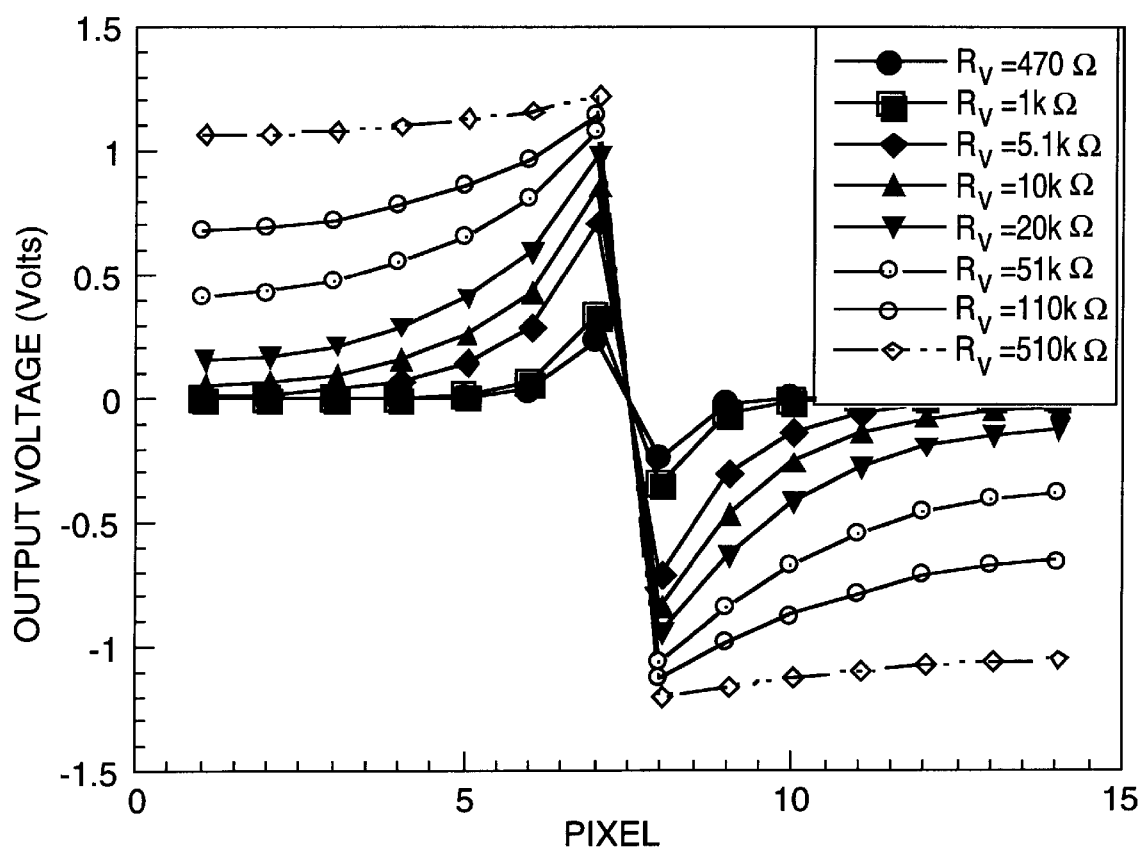

FIG. 37 is a graph of the high pass filter response of the TF Spatial Filter to a step function input, constructed with conducting PEDOT.

Figure 38:
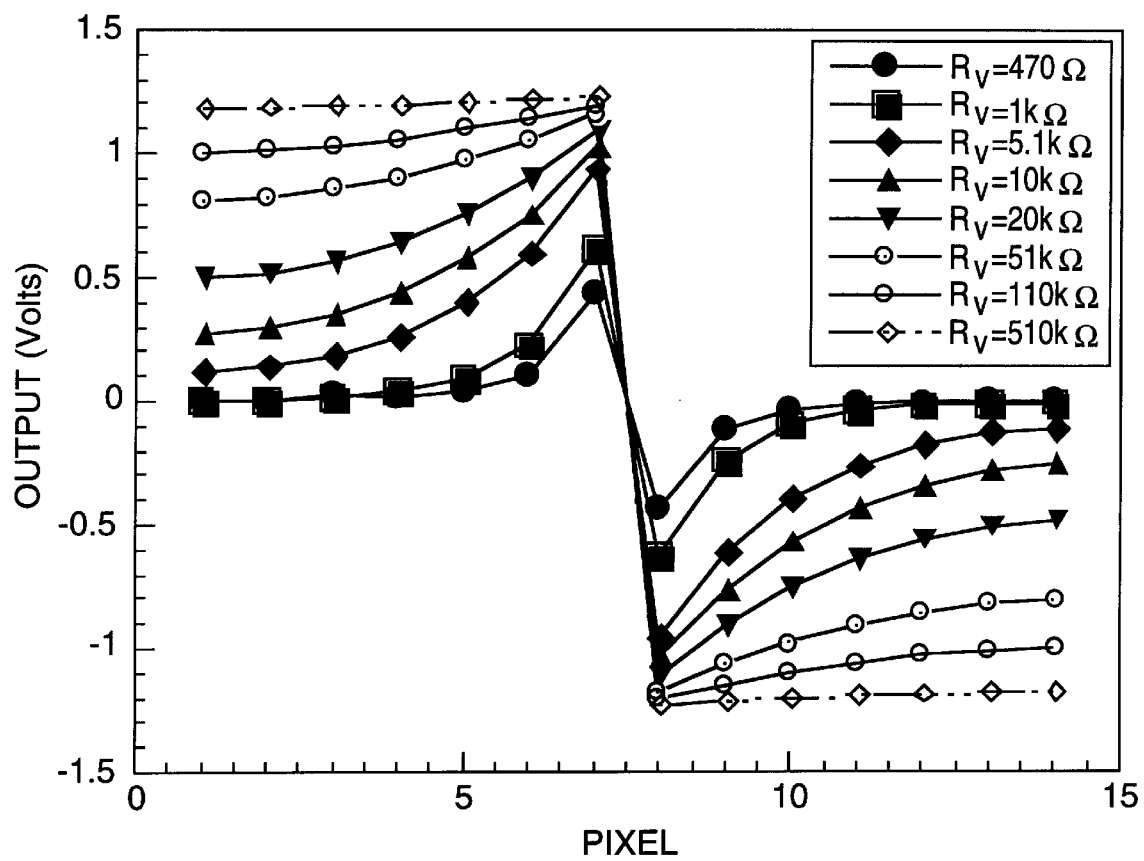

FIG. 38 is a graph of the high pass filter response of the TF Spatial Filter to a step function input, constructed with a 10% blend of PANI in a PES host.

Figure 39:
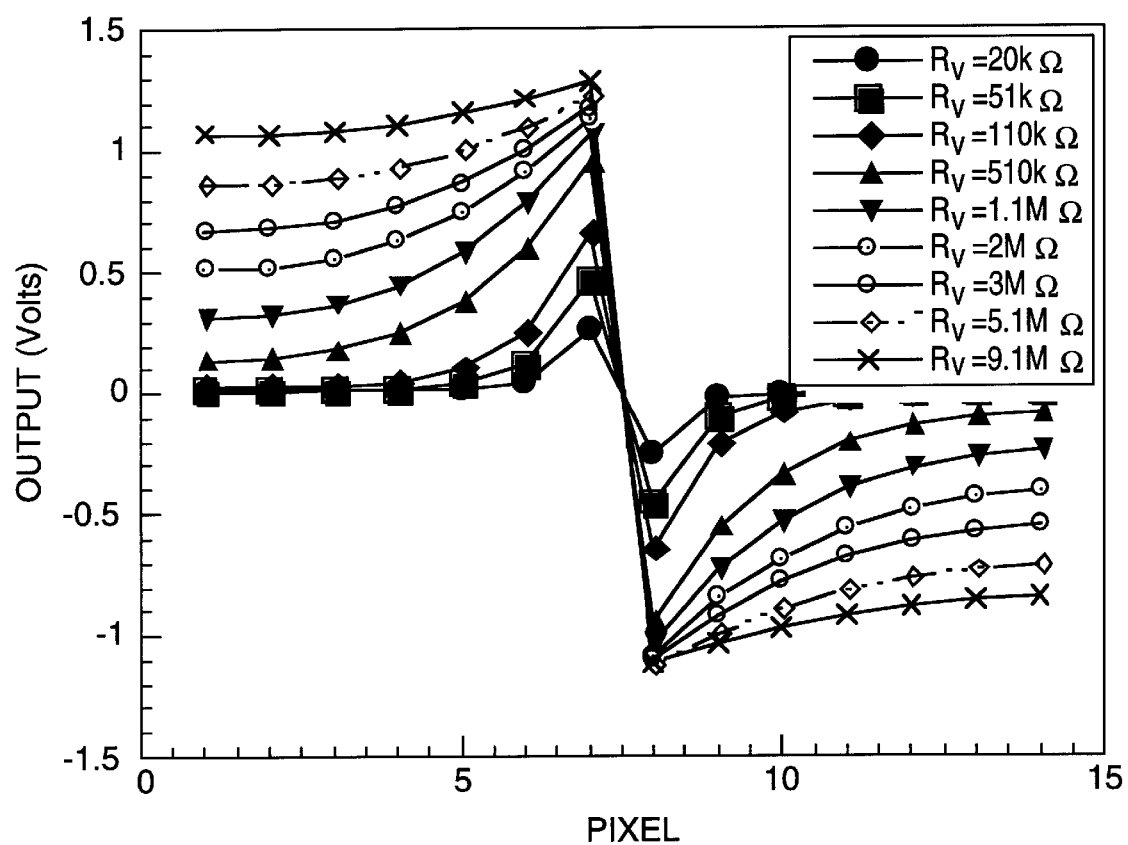

FIG. 39 is a graph of the high pass filter response of the TF Spatial Filter to a step function input, constructed with a 1% blend of PANI in a PES host.

Figure 40:
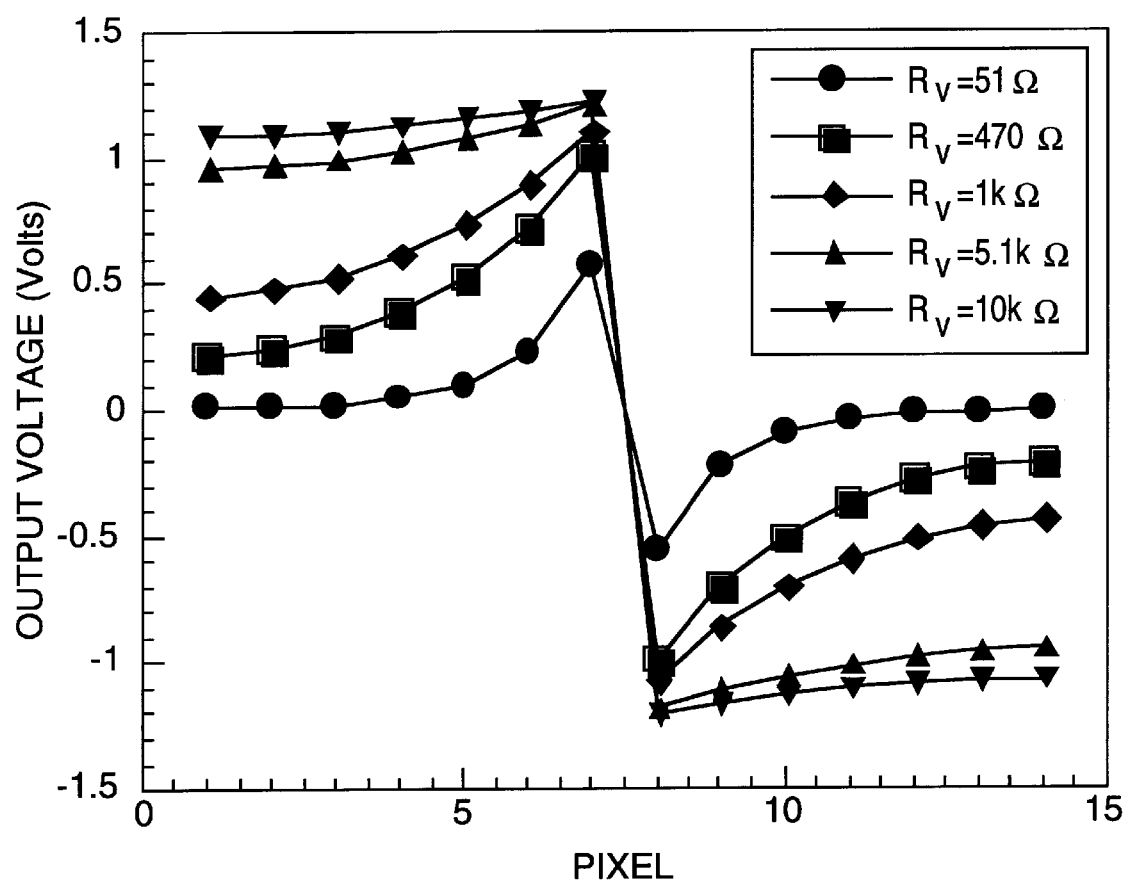

FIG. 40 is a graph of the high pass filter response of the TF Spatial Filter to a step function input, constructed with indium tin oxide (ITO).

Figure 41:
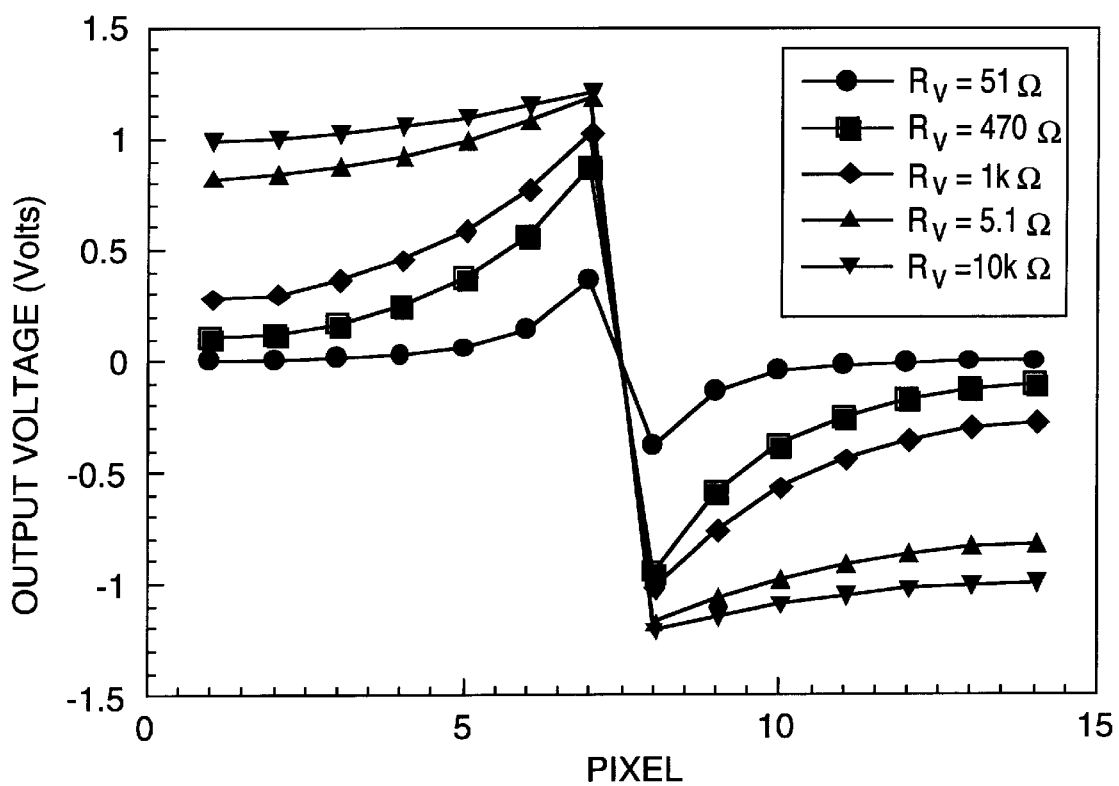

FIG. 41 is a graph of the high pass filter response of the TF Spatial Filter to a step function input, constructed with doped amorphous silicon.

FIGS. 42A, 42B, 42C and 42D are a demonstration of multipole bandpass filtering. An original image (42A) consisting of a random distribution of three circle sizes was subjected to multipole bandpass filtering: 42B) single pole; 42C) double pole; 42D) triple pole.

Figure 43:
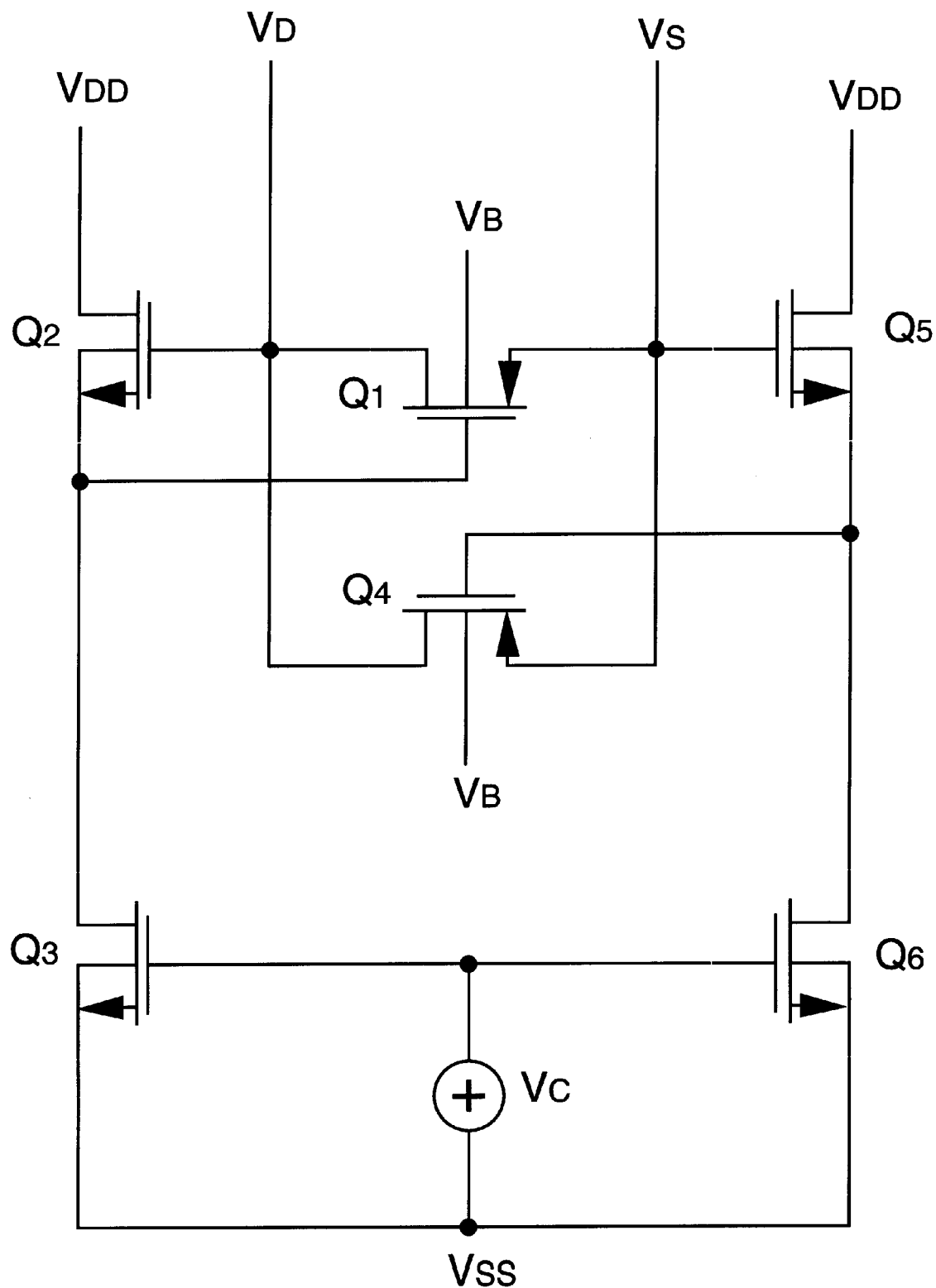

FIG. 43 is an example of a FET circuit which emulates a variable linear resistor. Voltage is applied across the $V_s$ and the $V_d$ terminals, and the effective resistance is controlled by $V_c$.

DESCRIPTION OF THE PREFERRED EMBODIMENTS

The Thin Film Spatial Filter (TF Spatial Filter) of this invention provides a simple solution to the drawbacks of the existing spatial frequency filtering implementations. It is a hybrid structure, which combines the strengths of analog VLSI technology with the simplicity of a continuous sheet resistance. By replacing the multiple FET lateral conductance circuit (as in the Mead implementation [C. M. Mead, Analog VLSI and Neural Systems, 1989]) with a continuous semiconductor sheet, the number of FET components in the unit cell is greatly reduced, thereby reducing the required pixel area by nearly a factor of five. Thus, with the TF Spatial Filter, large format arrays can be fabricated to satisfy the heavy processing needs for high definition images. Furthermore, the reduction of the number of FET components greatly reduces the response time of these arrays, as a result of the reduction in effective lateral capacitance of the system. The response time for the TF Spatial Filter is below $10^{-7}$ seconds, implying that the processing rate is limited only by the input/output rate of the multiplexer. Additionally, the power consumption of the TF Spatial Filter is greatly reduced relative to both computational and discrete FET implementations. This reduction results from the fact that in the TF Spatial Filter the power consumed by the array is entropy driven, i.e. power is consumed only when and where there is contrast in the input image. In contrast, the discrete approach draws significant power even under quiescent conditions. For a 256×256 array TF Spatial Filter, the average power consumption is expected to be <50 mW. The reduced power consumption reflects the fact that the lateral resistance layer does not draw any quiescent (overhead) power.

An important feature of the TF Spatial Filter design is the ability to select the mode of operation either as a low pass filter or as a high pass filter (or any linear combination thereof). Consequently, two of these arrays operated in series, one operated as a low pass filter and the other as a high pass filter, will function as a bandpass filter. With a bandpass spatial frequency filter, a specific spatial frequency band can be selected from images; band pass spatial frequency filtering is a powerful tool for selecting features of a given dimension. The combination of several of these bandpass elements, each tuned to the same bandpass center frequency, enables multipole bandpass filtering, which provides improved spatial frequency discrimination away from the center frequency of the bandpass filter.

The agility of the TF Spatial Filter of this invention is further improved by providing a variable blurring length, which translates to a control of the cutoff frequencies for the low and high pass filter operation. When several of these devices are combined to operate as a multipole bandpass filter, one has a very agile control of the center frequency of the bandpass filter. Therefore it is possible, by a simple external user control, to select distinct spatial features in an image.

An example of the Thin Film Spatial Filter is shown schematically in FIG. 1 as 10. It is a simple thin film structure consisting of a resistive layer with an array of ganged resistors defining the pixels. Current passing through each resistor is spatially blurred by the lateral conduction afforded by the resistive layer, resulting in an output which can be tuned to either a low pass or a high pass spatial frequency filter. Each of the ganged "resistors" which define the pixels in FIG. 1 can be actual resistors 6a, 6b, 6c etc. or they can be simple circuits (comprising FETs) that function as voltage variable resistors. Using an FET circuit that functions as a series resistor is preferable, because in this case the series resistance value can be externally controlled by changing the voltage applied to the FET circuit independently of scene content. With this external control, one can vary the decay length and thereby externally control the roll-off of the spatial frequency filter.

The blurring parameter (or decay length), N, is defined as the number of pixels over which the local averaging takes place, and is given by the following expression:

$$N \equiv \sqrt{\frac{R_{\it eff}}{R_L}} \qquad (1)$$

where $R_L$ and $R_{\it eff}$ are the lateral and (effective) vertical resistances of the structure, defined by $$\frac{1}{R_{\it eff}} = \frac{1}{R_v} + \frac{1}{R_1} \qquad (1a)$$

$$R_1 = \frac{\rho_b d}{a^2} \qquad (1b)$$

$$R_L = \frac{\rho_p b}{ta} \qquad (1c)$$

The parameters a and b refer to the width of the pixel and separation between pixels, respectively, whereas t and d correspond to the thickness of the conductive (blurring) and insulating layers.

In general, the blurring parameter is given by $$N \alpha \frac{1}{\sqrt{R_L}}$$

and is controlled by the film resistance.

Traditionally, spatial frequency filtering of images has been done in software, after downlinking to a large main frame computer. However, on space based platforms, the analysis of multispectral data at high temporal rates, especially for large format images, requires supercomputer capability and is therefore impractical. Sensor fusion prior to downlinking is the solution to this problem. The TF Spatial Filter offers a means for achieving sensor fusion for large format images at high frame rates.

The larger vision of the potential for the TF Spatial Filter is of an analog image processing super-architecture that combines TF Spatial Filters for a variety of sophisticated functions. For example:

(i) Ceramic carrier modules would be ideal for the TF Spatial Filters. The fact that this is an existing technology in the semiconductor industry makes this implementation attractive.

(ii) Wafer scale integration is an especially attractive possibility for this technology due to the simplicity and inherent fault tolerance of the TF Spatial Filter. FIG. 2 shows a schematic representation of a possible implementation. The result is a parallel computation of non-contiguous spatial frequencies, which could be accomplished within the frame time of the focal plane readout.

The TF Spatial Filter is a multifunctional image processing tool.

(i) With a simple external user control (i.e. a potentiometer), the TF Spatial Filter can function as either a low pass or high pass spatial filter (or a linear combination thereof).

(ii) By combining a low pass filter and a high pass filter in series (with different blurring lengths), a band pass filter is obtained.

The basic functions of the TF Spatial Filter are summarized in FIG. 3.

Low Pass Spatial Filter

FIG. 4 shows an airplane on a runway. FIG. 4b shows the clean image (from FIG. 4a) with high-frequency noise superimposed, such that the signal to noise is approximately 1; the plane is difficult to detect when shrouded by this noise. However, if one applies a "blurring" function (FIG. 4c), which averages over a chosen number of neighboring pixels, the higher frequency noise is averaged out, while preserving the majority of the plane detail. Mathematically, this operation can be expressed as $V_{out}=<V_{in}>$, where $<V_{in}>$ is the input image blurred over N pixels. Clearly, the function of the blurring "algorithm" is to pass the low spatial frequencies (primarily the plane), while suppressing the high frequency information (primarily the noise). As with other filtering schemes, there is a tradeoff in the quality of the desired image, as the sharper edges of the plane are blurred along with the undesired noise; however, the net result is an enhanced version of the noisy scene.

The low pass spatial filter can be described by the modulation transfer function (MTF), which is a measure of the throughput of the "filter" with respect to spatial frequency, $$V_{out}(k)=MTF_{lp}(k)V_{in}(k) \quad (2)$$

where k is the wave vector, and $V_{in}$ and $V_{out}$ are the input and output images, respectively. For blurring, the operation is a low pass filter, as shown in the schematic MTF curve plotted in FIG. 5. The characteristic roll-off frequency of the low pass filter is determined by the blurring length, see equation (1); a large blurring length yields a low rolloff frequency, whereas a small blurring length yields a higher rolloff frequency.

High Pass Spatial Filter

Consider next the case where it is desired to adjust the intensity at each pixel by an amount equal to the locally averaged input (local contrast control). This will have the effect of removing the low spatial frequency content of the image, while passing the sharper (high contrast) features. FIG. 6b displays an example of such an operation on the image of Dr. Einstein shown in FIG. 6a. The calculation performed on the image can be expressed as $$V_{out}=V_{in}-<V_{in}> \quad (3)$$

where again $<V_{in}>$ is the input image blurred over N pixels. Notice that the processed image of Dr. Einstein only contains the high contrast features (edges); the slowly varying features are completely removed (for example, slow variations in background intensity).

The operation described by Equation 3 functions as a high pass spatial filter which can also be described by a MTF as follows:

$$V_{out}(k)=V_{in}(k)-MTF_{lp}(k)V_{in}(k) \quad (4)$$

or $$V_{out}(k)=[1-MTF_{lp}(k)]V_{in}(k) \quad (5)$$

which implies $$MTF_{hp}=1-MTF_{lp} \quad (6)$$

where $MTF_{hp}$ and $MTF_{lp}$ are the modulation transfer functions for the high pass and low pass filters, respectively. An example of a $MTF_{hp}$ is sketched in FIG. 7 which shows that features in the image below a certain spatial frequency are completely suppressed, whereas higher spatial frequency features persist. As with the low pass filter, the rolloff frequency is controlled by the blurring length; a large blurring length yields a low rolloff frequency whereas a small blurring length yields a higher rolloff frequency.

The algorithm described by C. M. Mead (Analog VLSI and Neural Systems, 1989) for local contrast gain control is a subset of the high pass spatial frequency filtering capability discussed above. By taking the logarithm of the input image before filtering, one obtains a much wider dynamic range of response, and the local contrast control described previously is realized for a very wide range of input background levels. If the input voltage to pixel i is assumed to be the logarithm of the input intensity I(i) from each detector, $$V_{in}(i)=V_o logI(i) \quad (7)$$

then the output becomes $$V_{out}(i)=V_o logI(i)-(V_o/N)\Sigma_j logI(j) \quad (8)$$

or $$v_i = V_o \log\left[\frac{I_i}{(\Pi I_j)^{\frac{1}{N}}}\right] \quad (9)$$

The Mead algorithm is demonstrated using FIG. 8, which depicts two different variations of the Einstein photo shown in FIG. 6a. FIG. 8a shows the original 8 bit image of Dr. Einstein multiplied by a ramp function which ranges from 0 on the left to 255 on the right; the new image is therefore a 16 bit grayscale image which contains all of the information from the original photo. FIG. 8b was obtained from the same original Einstein image, this time multiplied by a non-abrupt step function, with the result being again a 16 bit image. If the direct Mead algorithm is applied to this set of images (with N=100), the results appear as shown in FIG. 8c and d. Notice that the DC pedestal from the background functions is removed (i.e. the gradient and gradual step), and the resulting images contain nearly all of the spatial content of the original photo of Dr. Einstein (with the exception of the low frequency components). The slight "overshoot" in the center of FIG. 8d is a result of the incompatibility of the blurring length (N=100) relative to the distance over which the intensity changes in the rounded step function. The Mead implementation is a powerful means to providing background suppression on images with large DC pedestals.

Bandpass Spatial Filter

By using the output of the low pass spatial filter as the input to the high pass spatial filter (each with a different cutoff frequency), one can create a band pass spatial filter. In terms of the MTF formalism this can be written as, $$V_{out}(k) = MTF_{low}(k) MTF_{high}(k) V_{in}(k) \quad (10)$$

so that the system MTF is a product of the MTFs of the individual filters. This is shown schematically in FIG. 9. For example, as shown in FIG. 10, one can take the original image of Dr. Einstein shown in FIG. 10a, blur it with a low N (low pass spatial filtering, FIG. 10b), and then subject it to high pass spatial filtering, with a larger N' (FIG. 10c). The net result is an image whose medium frequencies are transmitted, and low/high frequency features are suppressed. The band pass spatial frequency can be tuned by the proper choice of the blurring lengths of the filters, as demonstrated in FIG. 10, which shows the processed image for a different choice of N and N'.

As shown in FIG. 11, by sending an image through a series of these band pass spatial filters (each with the same center frequency), the bandwidth of the collective filter is significantly narrowed. FIG. 11 demonstrates spatial frequency selection. The original image consists of three sinusoidally varying patterns of grayscale, each with a different characteristic spatial frequency. The image is then passed through a series of band pass spatial filters, whose center frequency is tuned to the spatial frequency of the middle grayscale pattern. The intensity of the middle pattern remains relatively unchanged, while the higher and lower spatial frequency patterns are suppressed; after 6 iterations, the high and low frequency patterns are nearly completely removed.

Advantages Over Digital Image Processing

The image processing functions described above have been simulated in the software domain. The TF Spatial Filter of this invention is capable of implementing these processing functions in real time. With the TF Spatial Filter, these processing functions are accomplished in the analog domain by a thin film device which functions as a specialized parallel processing "computer" for image processing. This effective computation speed is equivalent to that of a supercomputer in a structure with almost unlimited restriction on array format.

The alternative use of on-board digital Fast Fourier Transform (FFT) methods to accomplish these processing goals has two fundamental problems: On-board digital FFT methods are too slow for the volume of data expected (for example, in hyperspectral and ultraspectral systems); and they preclude fusion prior to A/D conversion. The processing of large format systems at fast frame rates with many spectral images is a supercomputer computation.

Comparison with the "Smart Polymer Image Processor"

There are significant differences between the Thin Film Spatial Filter and the "Smart Polymer Image Processor" [U.S. patent application Ser. No. 08/417,198]. First and foremost, in contrast to the "Smart Polymer Image Processor", a three layer device, the TF Spatial Filter is fabricated with at most two layers of semiconducting materials; these layers can consist of any two materials whatsoever, as long as the conductivities of these layers are sufficiently ifferent to provide the lateral blurring function. The TF Spatial Filter can also be fabricated with only one layer, and will function with any material which possesses the sheet resistance uniformity required by the application. An important difference with the TF Spatial Filter design is the fact that the high conductivity (blurring) layer can be continuous (non-porous). This is to be contrasted with the "Smart Polymer Image Processor" design, which requires a porous layer of polyaniline (PANI) sandwiched between two insulating polymer layers; the device would not function as described without the porosity. The fact that the TF Spatial Filter can be constructed with a single conducting layer implies a dramatically simplified fabrication over the "Smart Polymer Image Processor". As a result of this invention, the TF Spatial Filter allows for versatility in its function as an image filter: it can function as either a low pass or a high pass spatial frequency filter, with a simple external user control. The "Smart Polymer Image Processor", however, can only function as a high pass filter, making it an image processor of very limited utility.

This invention describes Thin Film Spatial Filters (TF Spatial Filter). The basic structure of an implementation of the TF Spatial Filter is shown schematically in FIG. 1 as 10 and 10b.

Figure 1A:
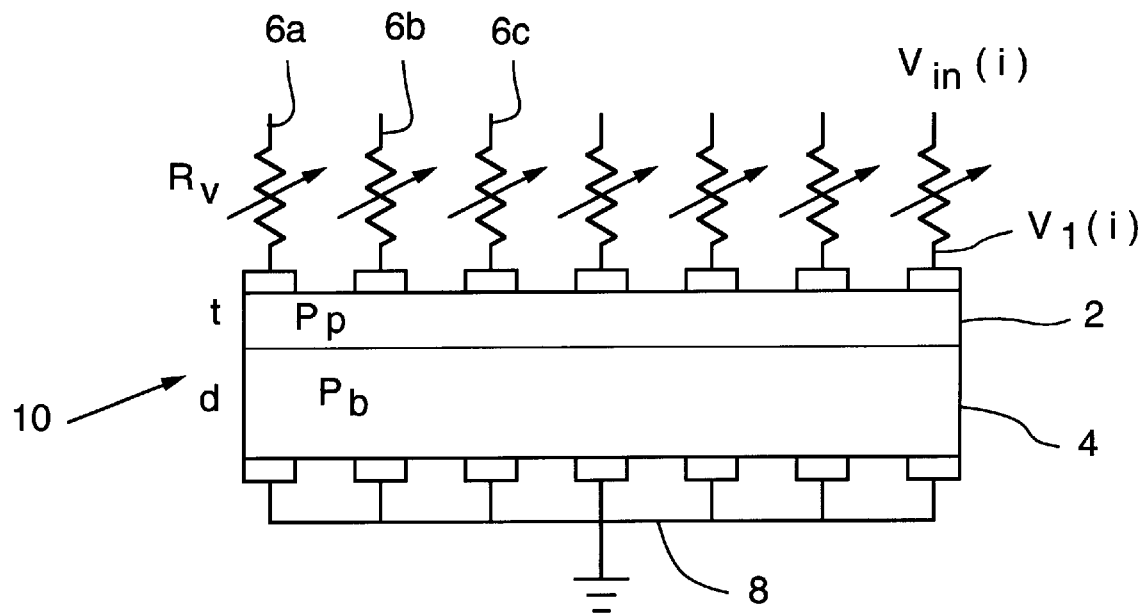
FIGS. 1A and 1B are example schematics of the TF Spatial Filter implementations.

FIG. 1a shows the structure for use in applications where the device must be grounded. In this case, the blurring is accomplished by a conducting bilayer. The top layer 2 comprises of a low resistivity material ($r_p$), which provides the lateral blurring required for image processing applications. The bottom layer 4 comprises a high resistivity layer ($r_b$) which prevents the top layer from shorting to ground. In this case, the blurring number is given by $$N \equiv \sqrt{\frac{R_{eff}}{R_L}}$$

where $R_L$ and $R_{eff}$ are the lateral and (effective) vertical resistances of the structure, defined by $$\frac{1}{R_{eff}} = \frac{1}{R_v} + \frac{1}{R_1}$$

$$R_1 = \frac{\rho_b d}{a^2}$$

$$R_L = \frac{\rho_p b}{ta}$$

$R_v$ is the resistance associated with the variable (ganged) resistors. The parameters a and b refer to the width of the pixel and separation between pixels, respectively, whereas t and d correspond to the thickness of the conductive (blurring) and insulating layers.

Figure 1B:
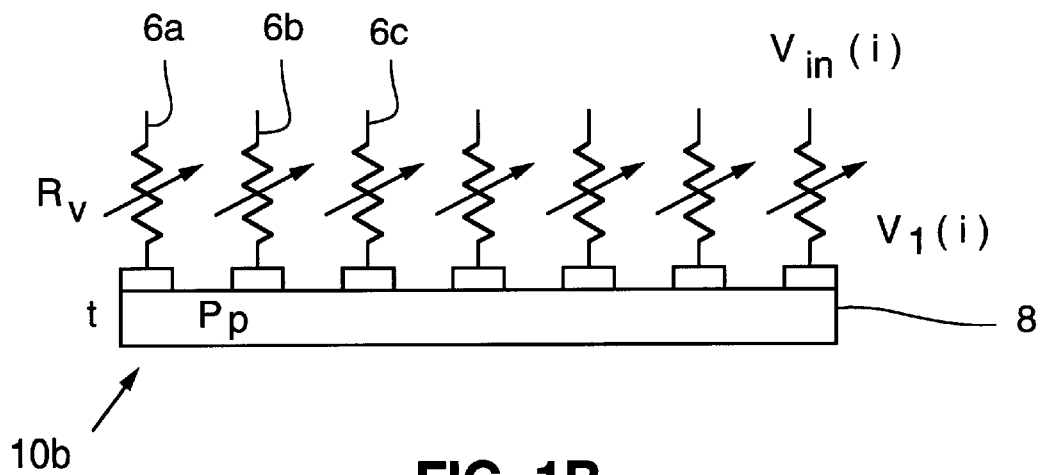

As shown in FIG. 1b, in applications where the device 10b is floating (not grounded), the blurring is accomplished by a single conducting layer 8 which comprises a low resistivity material ($r_p$), which provides the lateral blurring required for image processing applications. In this case, the blurring parameter is given by $$N \equiv \sqrt{\frac{R_v}{R_L}}$$

where $R_v$ is the resistance associated with the variable (ganged) resistors, and $$R_L = \frac{\rho_p b}{ta}$$

Thus, for either embodiment, the blurring length can be varied by changing $r_p$, by changing t, or by changing the value of the series resistance in each pixel.

In general, the blurring parameter is given by $$N \alpha \frac{1}{\sqrt{R_L}}$$

In a preferred embodiment, the TF Spatial Filter comprises an x-y array of pixels each defined by a contact pad to the underlying conducting layer. The array could be an array of any size; for example 128 by 128, 256 by 256, 512 by 512 or 1024 by 1024. In each pixel, the series resistance circuit provides the input and the output as indicated. The image to be processed, for example, from a corresponding array of photodetectors (for example, 128 by 128, 256 by 256, 512 by 512 or 1024 by 1024 arrays of photodetectors) is first multiplexed out of the detector array and then de-multiplexed onto the pixels of the TF Spatial Filter in one-to-one correspondence with the original image. The output from each pixel provides the spatially filtered version of the input image. The output can be multiplexed, subjected to analog-to-digital conversion and subsequently processed in digital form.

In a preferred embodiment, the output is multiplexed and subsequently displayed for view, for example on a cathode ray tube, a liquid crystal display or an emissive display, or the like.

The Ganged Series Resistors (One for Each Pixel)

In a preferred embodiment, the series resistance is the same for each of the pixels in the array (the resistors are 'ganged').

In a preferred embodiment, the series resistance is not necessarily the same for each of the pixels in the array.

In a preferred embodiment, each of the ganged "resistors" 6 which define the pixels in FIG. 1 are actual resistors.

In a more preferred embodiment, each of the ganged "resistors" 6 which define the pixels in FIG. 1 are simple circuits (comprising FETs) that function as voltage variable resistors. Using an FET circuit that functions as a series resistor is preferable, because in this case the series resistance value can be externally controlled by changing the voltage applied to the circuit. With this external control, one can vary the decay length and thereby vary the roll-off of the spatial frequency filter. An example of such a voltage variable resistor circuit is provided in Example 16. Other circuits which function as series resistors are well known in the art; all that is required is that the tuned resistance be independent of the scene dependent current draw.

In a more preferred embodiment, the number of FETs comprising the variable resistance circuit is minimized; the fewer the better. More FETs take up more space and thereby require larger sized pixels. A minimum sized pixel is preferred in order to make possible large scale x-y arrays, for example 256 by 256, 512 by 512 or 1024 by 1024.

The Conducting Layer (or Bilayer)

The conducting layer comprises a conducting material with resistivity $r_p$ and thickness t. The values of $r_p$ and t, together with the series resistance value, $R_s$, are chosen to yield the desired decay length according to Equation 1. The composition of the conductive layer is not critical. Materials with stable resistivity and with dimensional stability are preferred. Since the value of the series resistance obtained with the FET circuit implementation is in the range of $10^3 \Omega$–$10^8 \Omega$, the resistivity of the conducting layer should be in the range of $10^{-2} \Omega$-cm to $10^8 \Omega$-cm, with a thickness between 50 Å units and 1 cm. These values will yield a blurring parameter in the range $10^{-3}$ to $10^3$.

In a preferred embodiment, the conducting layer comprises a conducting polymer or a blend of conducting polymer with an insulating polymer. In the latter case, the resistivity of the layer can be varied by varying the volume fraction of conducting polymer in the blend.

In a more preferred embodiment, the conducting layer(s) of the TF Spatial Filter is fabricated from soluble conducting conjugated polymers (and/or their precursor polymers), cast from solution. Solution casting is simple and enables the fabrication of large active areas. Examples of metallic polymers that are processable from solution include, but are not limited to polyaniline (emeraldine salt form) and doped poly(ethylenedioxythiophene). Although solution casting is preferred, the conducting layer can be formed by in-situ polymerization of doped material; for example, of polypyrrole, polyaniline, or polythiophene.

Inorganic materials can also be used for the conducting layer. Examples include, amorphous silicon, indium/tin-oxide and amorphous carbon. Such materials can be formed into conducting layers by methods well known in the art. Again, the composition of the inorganic conducting layer is not critical; materials with stable resistivity and with dimensional stability are preferred. Since the value of the series resistance obtained with the FET circuit implementation is in the range of $10^3 \Omega$–$10^8 \Omega$, the resistivity of the conducting layer should be in the range of $10^{-2} \Omega$-cm to $10^8 \Omega$-cm, with a thickness between 50 Å units and 1 cm. These values will yield a blurring parameter in the range $10^{-3}$ to $10^3$.

The single layer configuration (FIG. 1b) is preferred. In cases where the bilayer is required, care must be taken to ensure that the two layers comprising the bilayer remain intact with minimal intermixing.

Use of Thin Film Spatial Filters for Spatial Frequency Filtering

For the example TF Spatial Filter implementation shown in FIG. 1, the input voltages are applied to the resistors $R_v$, which results in a diffusive spreading of the currents throughout the structure. The output voltage can be solved using Kirchoff's Laws (FIG. 12):

$$I_{in}(i) + I_l(i) = I_{out}(i) + I_r \tag{11}$$

where $I_l$ and $I_r$ are the lateral currents entering and leaving the "cube" (see FIG. 12) from layer 1, and $I_{in}$ and $I_{out}$ are the currents traversing the pixel vertically. In one dimension, these currents become:

$$I_l(i) = \frac{V_1(i-1) - V_1(i)}{R_L} \tag{12}$$

$$I_r(i) = \frac{V_1(i) - V_1(i+1)}{R_L}$$

$$I_{in}(i) = \frac{V_{in}(i) - V_1(i)}{R_v}$$

$$I_{out}(i) = \frac{V_i(i)}{R_1}$$

$R_1$ and $R_L$ are the vertical and horizontal resistances corresponding to layers 1 and 2, respectively, and are defined by the device geometry:

$$R_1 = \frac{\rho_b d}{a^2} \tag{13}$$

$$R_L = \frac{\rho_b d}{at}$$

where d and t are the thicknesses of layers 1 and 2, respectively; a and b are the pixel width and the separation between adjacent pixels, respectively. Substituting Equation 12 into Equation 11 results in the following difference equation:

$$2V_1(i)\left[1 + \frac{R_L}{2R_{\text{eff}}}\right] - V_1(i+1) - V_1(i-1) = \frac{R_L}{R_v}V_{\text{in}}(i) \quad (14)$$

where $$\frac{1}{R_{\text{eff}}} = \frac{1}{R_1} + \frac{1}{R_v} \quad (15)$$

Notice that for the single conducting layer embodiment, $R_1 = \infty$, which implies that $$(R_{\text{eff}})_{\text{single}} = R_v \quad (15a)$$

Taking the Fourier transform of Equation 14, results in the k-space solution for $V_1$:

$$V_1(k) = \frac{R_L}{2R_v}\left[\frac{V_{\text{in}}(k)}{1 + \frac{R_L}{2R_{\text{eff}}} - \cos(kc)}\right] \quad (16)$$

where c is the pitch of the array. The modulation transfer function (MTF) for $V_1$ is then obtained by dividing this response by $V_{in}$:

$$MTF(k) = \frac{R_L}{2R_v}\left[\frac{1}{1 + \frac{R_L}{2R_{\text{eff}}} - \cos(kc)}\right] \quad (17)$$

For small values of $R_L/R_{\text{eff}}$, Equation 17 becomes $$MTF(k) \approx \frac{R_L}{R_v}\left[\frac{1}{(kc)^2 + \frac{R_L}{R_{\text{eff}}}}\right] \quad (18)$$

The output voltage behaves as a low pass spatial frequency filter: At low spatial frequencies (i.e. a nearly constant input spatial profile), the transmission of the "filter" is high; conversely, at large spatial frequencies, where the pixel to pixel input voltage variations are large, the transmission is significantly reduced. The rolloff frequency of this filter can be determined approximately by the expression $$k_o c = \frac{1}{N_{\text{eff}}} \quad (19)$$

where $$N_{\text{eff}} = \sqrt{\frac{R_{\text{eff}}}{R_L}} \quad (20)$$

is the effective number of pixels the system is blurring over. One can obtain the MTF of a true low pass filter (i.e. a filter whose transmission is unity at k=0) by dividing Equation 18 by its k=0 value:

$$MTF_{lp} = \frac{R_v}{R_{\text{eff}}}MTF(k) \quad (21)$$

which implies $$MTF(k) = \frac{R_{\text{eff}}}{R_v}MTF_{lp} \quad (22)$$

Equation 16 can be converted back to real space to yield the solution for $V_1(i)$:

$$V_1(i) = \frac{R_{\text{eff}}}{R_v} \cdot \frac{1}{2P}\sum_{j=-\infty}^{\infty}[M]^{-|i-j|}V_{\text{in}}(j) \quad (23)$$

where $$M = 1 + \frac{R_L}{2R_{\text{eff}}} + \sqrt{\left(1 + \frac{R_L}{2R_{\text{eff}}}\right)^2 - 1} \quad (24)$$

$$P = \sqrt{\left(\frac{2R_{\text{eff}}}{R_L} + 1\right)^2 - \left(\frac{2R_{\text{eff}}}{R_L}\right)^2}$$

Equation 23 can be recast in a useful form, $$V_1(i) = \frac{R_{\text{eff}}}{R_v}\langle V_{\text{in}}\rangle \quad (25)$$

where the average input voltage $$\langle V_{\text{in}}\rangle$$

is defined by $$\langle V_{\text{in}}\rangle = \frac{1}{2P}\sum_{j=-\infty}^{\infty}[M]^{-|i-j|}V_{\text{in}}(j) \quad (26)$$

In the case where $$\frac{R_L}{2R_{\text{eff}}} \ll 1,$$

Equation 26 reduces to $$\langle V_{\text{in}}\rangle = \frac{1}{2N_{\text{eff}}}\sum_{j=-\infty}^{\infty}\exp\left[-\frac{|i-j|}{N_{\text{eff}}}\right]V_{\text{in}}(j) \quad (27)$$

Operation as a Low Pass Filter

The output voltage of the Thin Film Spatial Filter behaves as a low pass spatial frequency filter, with a MTF for the example implementation shown in FIG. 1 given by:

$$MTF(k) = \frac{R_L}{2R_v}\left[\frac{1}{1 + \frac{R_L}{2R_{\text{eff}}} - \cos(kc)}\right] \quad (28)$$

which can be recast as $$MTF(k) = \frac{R_{eff}}{R_v} MTF_{lp} \tag{29}$$

Since $R_v$ is by definition a variable resistor, tuning of the rolloff frequency can be achieved by changing its value (Equations 15 and 20), as shown in FIG. 13. One therefore has a great deal of flexibility for adjusting the blurring length (and therefore the rolloff frequency of the low pass filter).

Operation as a High Pass Filter

In order to implement a high pass filter, it is necessary to measure an output which is the difference of the input and the blurred input, i.e.

$$V_{out}(i) = V_{in}(i) - \langle V_{in} \rangle(i) \tag{30}$$

where the brackets (< >) denote a spatial average. In terms of the output voltage, $$V_{out}(i) = V_{in}(i) - \frac{R_v}{R_{eff}} V_1(i) \tag{31}$$

Thus, in order to achieve a high pass filter, a weighted difference of the input and output voltages must be taken. This can be expressed in terms of the modulation transfer function $$MTF_{out} = MTF_{hp} = 1 - \frac{R_v}{R_{eff}} MTF(k) \tag{32}$$

or $$MTF_{hp} = \left[ \frac{1 - \cos(kc)}{1 + \frac{R_L}{2R_{eff}} - \cos(kc)} \right] \tag{33}$$

Equation 33 is plotted for various values of N in FIG. 14; clearly, at k=0 the transmission is suppressed, whereas at large k, the MTF approaches unity. The rolloff of the high pass filter is determined by Equation 20, as with its low pass counterpart. Again, tuning of this rolloff frequency is achieved by adjusting the variable resistor, $R_v$ (Equation 15).

Versatility of the Thin Film Spatial Filter: Changing from a Low Pass Filter to a High Pass Filter As demonstrated above, with the right linear combination of the input voltage and the output voltage, one can obtain either a low pass or a high pass filter. In addition, the TF Spatial Filter can be changed continuously from a low pass to a high pass filter, with a simple external user control. In this case the desired output function of the system is given by $$V_{out}(i) = fV_{in}(i) - \frac{R_v}{R_{eff}} V_1(i) \tag{34}$$

where f ranges from 0 to 1. Notice that when f=0, the system behaves as a low pass filter, and for f=1, the system becomes a high pass filter. Intermediate values of f will result in admixtures of a highpass and lowpass filter.

A simple dual op-amp circuit that will achieve this function is shown as 150 in FIG. 15. Other circuits which will accomplish this task are well known in the art. In FIG. 15, the first stage is simply an amplifier, whose output is given by $$V_a = \frac{R_v}{R_{eff}} V_1 \tag{35}$$

where $R_v$ is ganged with the variable resistors shown in FIG. 1. The second stage is a summing (unity) amplifier, whose output is $$V_{out} = -\left[ \frac{V_{in}}{\left(1 + \frac{R}{4R_c}\right)} - V_a \right] \tag{36}$$

where $R_c$ is a variable "control" resistor. Equation 36 can be recast in terms of $V_1$, $$V_{out} = -\left[ fV_{in} - \frac{R_v}{R_{eff}} V_1 \right] \tag{37}$$

where $$f \equiv \frac{1}{\left(1 + \frac{R}{4R_c}\right)} \tag{38}$$

Aside from the minus sign, Equation 37 implements Equation 34, since as $R_c \to 0$, $f \to 0$, and for $R_c \gg R$, $f \to 1$. Thus, by simply changing the external resistor $R_c$, the Thin Film Spatial Filter can be tuned to create either a high pass or a low pass filter.

The dual Op-amp circuit of FIG. 15 does not reside in the unit cell. It is a post-processing circuit which operates on the serial stream of data after the multiplexing (MUX) operation. The only condition for successful implementation of this circuit is that the output and input voltages are synchronized correctly. This has already been included in the design, as both $V_{in}$ and $V_1$ are measured as outputs on the same clock cycle.

Band Pass Filters Using Multiple TF Spatial Filters

Since it has been demonstrated that the Thin Film Spatial Filter can be operated as either a high pass or a low pass filter (or a linear combination), it is evident that two of these devices operated in series (with a different rolloff frequency selected via $R_v$), one operated as a high pass and the other as a low pass filter, will implement a band pass filter. This system, shown schematically in FIG. 16, requires the output of filter 1 to be used as the input to filter 2.

The only condition for efficient band pass transmission is that the rolloff frequency of the low pass filter must be greater than that of the high pass filter. FIG. 17 shows a MTF curve for a band pass filter, with $N_{low}=2.3$ and $N_{high}=10$.

The peak spatial frequency of the band pass MTF is determined by $$\sin\left(\frac{1}{2} k_o c\right) = \frac{1}{2} \frac{1}{\sqrt{N_{low} N_{high}}} \tag{39}$$

Because each N can be selected via the individual $R_v$, tuning of the band pass frequency is readily achieved via simple external user control. As can be seen from FIG. 18, the peak transmission at $k_o$ is not unity, but instead given by $$MTF_{bp}|_{max} = \frac{N_{high}^2}{(N_{high} + N_{low})^2} \quad (40)$$

so that if attenuation effects are required to be small, then for a given $k_o$, $N_{high} \gg N_{low}$.

Multipole Band Pass Filtering with the Thin Film Spatial Filter

As shown in FIG. 16, a band pass filter 160 can be readily implemented with two TF Spatial Filters in series, one operated as a low pass and the other as a high pass filter. For this combination, the transmission bandwidth is rather large, which is disadvantageous if one wishes to select a very narrow range of spatial frequencies. The transmission bandwidth can be narrowed by operating several of these band pass "blocks" in series, with each block tuned to the same spatial frequency $k_o$, as shown as 180 in FIG. 18.

As in the case of the single band pass implementation, the output of a given block is used as the input to the next block. This has the effect of multiplying the MTF curves of the individual band pass filters:

$$MTF_{mpbp} = (MTF_{bp})^m \quad (41)$$

where m is the number of repeated filters. FIG. 19 shows the effect of such a multiplication; as the number of blocks (m) increases, the linewidth of the multipole filter is dramatically reduced. The linewidth of this multipole filter can be approximated by $$\Delta(kc) \approx \sqrt{\frac{\ln(2)}{m}} \left( \frac{1}{N_{low}} + \frac{1}{N_{high}} \right) \quad (42)$$

where $\Delta k$ is the full width at half maximum (FWHM) of the multipole filter. Since the bandpass frequency is tunable, the multipole bandpass filter can be used to scan over a range of spatial frequencies (equivalent to taking the Fourier transform) while keeping the width of the filter constant. Equation 39 can be recast in terms of the width by using Equation 42:

$$k_o c = \sqrt{\frac{1}{N_{high}} \left[ \sqrt{\frac{m}{\ln(2)}} \Delta(kc) - \frac{1}{N_{high}} \right]} \quad (43)$$

so that simply changing $N_{high}$ in each block will have the effect of tuning the spatial frequency of the multipole bandpass filter (FIG. 20).

As shown in FIG. 20, for a given $\Delta(kc)$ (and m) there is a maximum $k_o$ that can be achieved:

$$(k_o)_{max} = \frac{1}{2} \sqrt{\frac{m}{\ln 2}} \Delta k \quad (44)$$

Thus, as m increases, the maximum spatial frequency one can scan (while preserving the filter width) also increases.

Time Response of the TF Spatial Filter

The temporal response of the TF Spatial Filter is an important parameter; the response time defines the maximum frame rate for image processing functions. In order to consider the time variation of the system, the capacitance of each layer must be considered and appropriately inserted into the difference equation (FIG. 21) Equations 12 above are modified as follows:

$$I_l(i) = \frac{V_1(i-1) - V_1(i)}{R_L} \quad (45)$$

$$I_r(i) = \frac{V_1(i) - V_1(i+1)}{R_L}$$

$$I_{in}(i) = \frac{V_{in}(i) - V_1(i)}{R_v} + C_v \left[ \frac{\partial V_{in}(i)}{\partial t} - \frac{\partial V_1(i)}{\partial t} \right]$$

$$I_{out}(i) = \frac{V_1(i)}{R_1} + C_1 \frac{\partial V_1(i)}{\partial t}$$

where $C_v$ and $C_1$ are the capacitances associated with the variable resistor and the continuous layer 1. The difference equation (Eqn. 14) then becomes $$\left[ \frac{R_L}{R_{eff}} \right] - V_1(i+1) - V_1(i-1) + R_L(C_v + C_1) \frac{\partial V_1(i)}{\partial t} = \frac{R_L}{R_v} V_{in}(i) + R \quad (46)$$

In equation 45, the lateral capacitance has been neglected, since the array pitch is assumed to be much larger than the device thickness. Taking the spatial Fourier transform of Equation 46 results in a differential equation which is first order in time:

$$-\cos(kc) + \frac{R_L}{2R_{eff}} \right] + R_L(C_v + C_1) \frac{\partial V_1(k,t)}{\partial t} = \frac{R_L}{R_v} V_{in}(k,t) + R_L C_v. \quad (47)$$

If it is assumed that $V_{in}(i)$ consists of a step function in time, i.e.

$$V_{in}(k,t) = \begin{cases} 0 & t < 0 \\ V_{in}(k) & t > 0 \end{cases} \quad (48)$$

then $V_1(k,t)$ becomes $$_n(k) \frac{R_L}{2R_v} \left( \frac{1}{1 - \cos(kc) + \frac{R_L}{2R_{eff}}} \right) \left\{ 1 - \exp\left[ -\frac{2t}{\tau_{RC}} (1 - \cos(kc) \right] \right\} \quad (49)$$

with $t_{RC} = R_L(C_1 + C_v)$. The time dependent MTF can then be obtained by dividing Equation 49 by $V_{in}(k)$:

$$= \frac{R_L}{2R_v} \left( \frac{1}{1 - \cos(kc) + \frac{1}{2N_{eff}^2}} \right) \left\{ 1 - \exp\left[ -\frac{2t}{\tau_{RC}} (1 - \cos(kc) + \right] \right\} \quad (50)$$

FIG. 22 shows the time evolution of Equation 50; as t becomes very large, the MTF approaches that of Equation 17. The relaxation time of the system is determined by $$\tau_{rel} = \frac{\tau_{RC}}{4\sin^2\left(\frac{kc}{2}\right) + \frac{1}{N_{eff}^2}} \quad (51)$$

with a maximum value at k=0 given by $$(\tau_{rel})_{max} = \tau_{RC} N_{eff}^2 \quad (52)$$

Substituting Equation 20 into Equation 52, the maximum relaxation time can be expressed in terms of the parameters of the device:

$$(\tau_{rel})_{max} = R_{eff}(C_1 + C_v) \quad (53)$$

Since $R_{eff}$ is a function of $R_v$, the maximum relaxation time will change when the variable resistor is changed by the user. For example, for a TF Spatial Filter with a 30 μm pixel size, $R_{eff}$<100 kΩ, $C_1$, $C_v$<1 pF, which results in a maximum relaxation time $(t_{rel})_{max}$<1×10$^{-7}$ s. Therefore the maximum theoretical frame rate for the Thin Film Spatial Filter is enormous. This implies that spatial frequency scanning by the generation of sequential multipole filters can be accomplished within the frame time of the detector readout.

EXAMPLES

Example 1

One-dimensional single layer Thin Film Spatial Filters were fabricated with conducting polyaniline camphor sulfonic acid (PANI-CSA) spin cast onto a substrate with pre patterned Au electrodes. Onto a glass substrate was thermally deposited a series of 1000 Å thick Au (with a 50 Å adhesion layer) electrodes, using the fan out pattern shown in FIG. 23. The electrode width was 100 μm, with a separation between adjacent electrodes of 400 μm. A 2.5% solution (in m-cresol) of conducting PANI-CSA was spin cast onto the substrate (with electrodes) at 4000 rpm, at 25° C., resulting in a film thickness of approximately 500 Å [details about the preparation of the polyaniline (PANI) solution and PANI-CSA film have been disclosed in U.S. Pat. No. 5,232,631 which is herein incorporated by reference]. The cast films were baked at 85° C. in a vacuum oven for 12 hours in order to remove any excess solvent.

Electrical data were obtained with a Fluke 87 multimeter. The voltage source was a Elenco Precision Quad Power Supply. This source was used to supply a variety of input profiles to the TF Spatial Filter.

FIG. 24 demonstrates the pixel to pixel uniformity of the lateral resistance for the TF Spatial Filter. In this case, the resistance between pixel 1 and pixels 2–13 were measured (without $R_v$). Clearly, the data follow very closely a straight line, indicating a highly uniform sheet resistance for the PANI-CSA layer.

FIG. 25 shows the response of the TF Spatial Filter, operated as a low pass filter (i.e. output taken as $V_1$) to an input step function, with a voltage of 2.46 Volts applied to pixels 1–7, and pixels 8–14 grounded. Each curve represents a different value of the ganged resistors, $R_v$, ranging from 51Ω up to 10kΩ. It is clear that at the lowest value of $R_v$, the response curve of the device (a low pass filter) follows very closely the input function, indicating a very short decay parameter for the system (~0.75), consistent with Equation 1. Furthermore, at the highest value of $R_v$, the system response curve becomes nearly constant, and is essentially the global average of all of the input voltages; the spatial decay parameter in this case is very large (~10). The Thin Film Spatial Filter operated in this mode is a low pass spatial frequency filter, since the input image (profile) is blurred, with sharp (high frequency) features suppressed.

This example demonstrates that highly uniform TF Spatial Filters can be constructed using PANI-CSA films cast from solution, and that these devices operate as low pass spatial frequency filters. The desired cutoff frequency (spatial frequency rolloff parameter) can be adjusted by changing the ganged resistor, which indicates the strong versatility of the TF Spatial Filter.

The 500 Å thickness for the thin film is representative. Suitable thickness for the conductive and resistive film range from as little as 50 Å to as much as 10,000 Å or more with thicknesses in the range of 75 Å to 5,000 Å being very typical.

Example 2

Devices of example 1 were fabricated with the conducting polymer poly(ethylenedioxythiophene) (PEDOT) as the lateral resistive layer. This material was spin cast onto the Au patterned substrates described in example 1, from a water based solution of PEDOT the preparation of the PEDOT solution is known in the art at 2500 rpm. The resulting films were high quality, with a high sheet resistance uniformity, as indicated in FIG. 26. FIG. 27 shows the response of the low pass filter operation of the TF Spatial Filter (constructed with PEDOT) to an input step function of 2.46 Volts. The behavior was identical to that presented in example 1, with the low $R_v$ values giving rise to a short decay parameter, and the higher $R_v$ values yielding a longer spatial decay parameter.

This example demonstrates that the Thin Film Spatial Filter can be fabricated using PEDOT as the lateral resistive material, and that its operation as a low pass filter is consistent with theoretical analysis.

Example 3

Devices of example 1 were fabricated with 10% blends of the conducting polymer PANI-CSA in a low molecular weight polyester (PES) host. This blend was spin cast onto the Au patterned substrates described in example 1, from a m-cresol solution at 4000 rpm. The resulting films were high quality films, with a high sheet resistance uniformity, as indicated in FIG. 28. FIG. 29 shows the response of the low pass filter operation of the TF Spatial Filter (constructed with a 10% polyaniline/polyethylenesulfonate (PANI/PES) blend) to an input step function of 2.46 Volts. The behavior was identical to that presented in example 1, with the low $R_v$ values giving rise to a short decay parameter, and the higher $R_v$ values yielding a longer spatial decay parameter.

This example demonstrates that the Thin Film Spatial Filter can be fabricated using a 10% PANI/PES blend as the lateral resistive material, and that its operation as a low pass filter is consistent with theoretical analysis.

Example 4

Devices of example 1 were fabricated with 1% blends of the conducting polymer PANI-CSA in a low molecular weight polyester (PES) host. This blend was spin cast onto the Au patterned substrates described in example 1, from a m-cresol solution at 4000 rpm. The resulting films were high quality films, with a high sheet resistance uniformity, as indicated in FIG. 30. FIG. 31 shows the response of the low pass filter operation of the TF Spatial Filter (constructed with a 1% PANI/PES blend) to an input step function of 2.46 Volts. The behavior was identical to that presented in example 1, with the low $R_v$ values giving rise to a short decay parameter, and the higher $R_v$ values yielding a longer spatial decay parameter.

This example demonstrates that the Thin Film Spatial Filter can be fabricated using a 1% PANI/PES blend as the lateral resistive material, and that its operation as a low pass filter is consistent with theoretical analysis.

Example 5

One-dimensional single layer Thin Film Spatial Filters were fabricated with conducting indium tin oxide (ITO). A glass substrate (initially uniformly coated with ITO, with a sheet resistance of 1000Ω/square) was photolithographically patterned to produce a 1 cm×0.5 cm square of ITO. Al electrodes were then thermally deposited onto the ITO squares using the shadow mask design shown in FIG. 23.

FIG. 32 demonstrates the pixel to pixel uniformity of the lateral resistance for the TF Spatial Filter. In this case, the resistance between pixel 1 and pixels 2–13 were measured (without $R_v$). Clearly, the data follows very closely a straight line, indicating a highly uniform sheet resistance for the ITO layer.

FIG. 33 shows the response of the low pass filter operation of the TF Spatial Filter (constructed with ITO) to an input step function of 2.46 Volts. The behavior was identical to that presented in example 1, with the low $R_v$ values giving rise to a short decay parameter, and the higher $R_v$ values yielding a longer spatial decay parameter.

This example demonstrates that the Thin Film Spatial Filter can be fabricated using ITO as the lateral resistive material, and that its operation as a low pass filter is consistent with theoretical analysis.

Example 6

One-dimensional single layer Thin Film Spatial Filters were fabricated with doped amorphous silicon layers. A silicon substrate (initially uniformly coated with amorphous silicon and a $SiO_2$ buffer layer, with a sheet resistance of 900Ω/square) was photolithographically patterned to produce a 1 cm×0.5 cm square of amorphous Si. Al electrodes were then thermally deposited onto the ITO squares using the shadow mask design shown in FIG. 23.

FIG. 34 demonstrates the pixel to pixel uniformity of the lateral resistance for the TF Spatial Filter. In this case, the resistance between pixel 1 and pixels 2–13 were measured (without $R_v$). Clearly, the data follows very closely a straight line, indicating a highly uniform sheet resistance for the amorphous silicon layer.

FIG. 35 shows the response of the low pass filter operation of the TF Spatial Filter (constructed with amorphous silicon) to an input step function of 2.46 Volts. The behavior was identical to that presented in example 1, with the low $R_v$ values giving rise to a short decay parameter, and the higher $R_v$ values yielding a longer spatial decay parameter.

This example demonstrates that the Thin Film Spatial Filter can be fabricated using amorphous silicon as the lateral resistive material, and that its operation as a low pass filter is consistent with theoretical analysis.

Example 7

The device described in example 1 (PANI-CSA) was operated as a high pass spatial frequency filter. This was achieved by measuring the voltage across each pixel in the array, yielding $V_{in}(i)-\langle V_{in}(i)\rangle$, the required output for a high pass filter. FIG. 36 shows the response of the TF Spatial Filter, operated as a high pass filter (i.e. output taken as $V_{in}-V_1$) to an input step function. It is clear that at the lowest value of $R_v$, the response curve of the device (a high pass filter in this case) shows very narrow spikes on either side of pixel 7, indicating a very short decay parameter for the system (large spatial cutoff frequency), consistent with Equation 1; in this case only the highest spatial frequencies are passed in the image. Furthermore, at the highest value of $R_v$, the system response showed elongated spikes near pixel 7, indicating a very large spatial decay parameter (low spatial cutoff frequency); in contrast to the lowest $R_v$ curve, more low frequency components are transmitted in this case. The Thin Film Spatial Filter operated in this mode is a high pass spatial frequency filter, with low frequency features suppressed.

This example demonstrates that highly uniform TF Spatial Filters can be constructed using PANI-CSA films cast from solution, and that these devices operate as high pass spatial frequency filters. The desired cutoff frequency (spatial frequency rolloff parameter) can be adjusted by changing the ganged resistor.

Example 8

Devices of Example 2 (PEDOT) were operated as high pass spatial frequency filters. FIG. 37 shows the response of the high pass filter operation of the TF Spatial Filter (constructed with PEDOT) to an input step function of 2.46 Volts. The behavior was identical to that presented in example 7, with the low $R_v$ values giving rise to a short decay parameter, and the higher $R_v$ values yielding a longer spatial decay parameter.

This example demonstrates that the Thin Film Spatial Filter fabricated using PEDOT can be operated as a high pass filter, consistent with theoretical analysis.

Example 9

Devices of example 3 (10% PANI/PES blends) were operated as high pass spatial frequency filters. FIG. 38 shows the response of the high pass filter operation of the TF Spatial Filter (constructed with 10% PANI/PES blends) to an input step function of 2.46 Volts. The behavior was identical to that presented in example 7, with the low $R_v$ values giving rise to a short decay parameter, and the higher $R_v$ values yielding a longer spatial decay parameter.

This example demonstrates that the Thin Film Spatial Filter fabricated using 10% PANI/PES blends can be operated as a high pass filter, consistent with theoretical analysis.

Example 10

Devices of example 4 (1% PANI/PES blends) were operated as high pass spatial frequency filters. FIG. 39 shows the response of the high pass filter operation of the TF Spatial Filter (constructed with 1% PANI/PES blends) to an input step function of 2.46 Volts. The behavior was identical to that presented in example 7, with the low $R_v$ values giving rise to a short decay parameter, and the higher $R_v$ values yielding a longer spatial decay parameter.

This example demonstrates that the Thin Film Spatial Filter fabricated using 1% PANI/PES blends can be operated as a high pass filter, consistent with theoretical analysis.

Example 11

Devices of example 5 (ITO) were operated as high pass spatial frequency filters. FIG. 40 shows the response of the high pass filter operation of the TF Spatial Filter (constructed with ITO) to an input step function of 2.46 Volts. The behavior was identical to that presented in example 7, with the low $R_v$ values giving rise to a short decay parameter, and the higher $R_v$ values yielding a longer spatial decay parameter.

This example demonstrates that the Thin Film Spatial Filter fabricated using ITO can be operated as a high pass filter, consistent with theoretical analysis.

Example 12

Devices of example 6 (amorphous silicon) were operated as high pass spatial frequency filters. FIG. 41 shows the response of the high pass filter operation of the TF Spatial Filter (constructed with amorphous silicon) to an input step function of 2.46 Volts. The behavior was identical to that presented in example 7, with the low $R_v$ values giving rise to a short decay parameter, and the higher $R_v$ values yielding a longer spatial decay parameter.

This example demonstrates that the Thin Film Spatial Filter fabricated using amorphous silicon can be operated as a high pass filter, consistent with theoretical analysis.

Example 13

Examples 1–6 demonstrated the operation of 1-dimensional TF Spatial Filters as low pass spatial frequency filters, constructed with a variety of material bases, and that the behavior of these devices was consistent with theoretical analysis. As a further example, computer simulations of the TF Spatial Filter, operated as a low pass spatial frequency filter, were performed on the Einstein photo shown in FIG. 10a.

The initial image was a 256×256 grayscale picture, with 8 bits per pixel resolution. The computer algorithm involved the solution to the two dimensional version of equation 14, with the input "voltages" (ranging from 0–255) provided by the original image. A Gauss-Sidel iteration method [R. L. Burden, *Numerical Analysis*, 1985] was used to solve the resultant $256^2 \times 256^2$ matrix, with an error tolerance of 0.01.

The result of the TF Spatial Filter low pass operation is shown in FIG. 10b. The spatial decay parameter, N (equation 1), was chosen to be 2.3, which provided a moderate blurring action. Clearly the behavior of this 2D simulation was consistent with the 1D device measurements, with the slowly varying image features passed, and the sharp contrast edges (high frequency features) suppressed.

This example demonstrates, via computer simulation, the utility of the 2 dimensional TF Spatial Filter as a low pass spatial frequency filter. The behavior is consistent with both the 1 dimensional fabricated structures and the theoretical analysis.

Example 14

Examples 7–12 demonstrated the operation of 1-dimensional TF Spatial Filters as high pass spatial frequency filters, constructed with a variety of material bases, and that the behavior of these devices was consistent with theoretical analysis. As a further example, computer simulations of the TF Spatial Filter, operated as a high pass spatial frequency filter, were performed on the Einstein photo shown in FIG. 6a.

The result of the TF Spatial Filter high pass operation is shown in FIG. 6b. The spatial decay parameter, N (equation 1), was chosen to be 2.3, which provided a moderate blurring action. Clearly the behavior of this 2D simulation was consistent with the 1D device measurements, with the slowly varying image features suppressed, and the sharp contrast edges (high frequency features) passed.

This example demonstrates, via computer simulation, the utility of the 2 dimensional TF Spatial Filter as a high pass spatial frequency filter. The behavior is consistent with both the 1 dimensional fabricated structures and the theoretical analysis.

Example 15

Examples 1–14 demonstrated the operation of the TF Spatial Filter as either a low pass or high pass spatial frequency filter. As a further example, computer simulations of the 2 dimensional TF Spatial Filter were used to implement a band pass spatial filter. This was accomplished by first processing the image using a TF Spatial Filter operated as a low pass filter, and then applying its output to another TF Spatial Filter, operated as a high pass filter. The result of this procedure is shown in FIG. 10, which depicts the photo of Einstein (10a) first subjected to a low pass TF Spatial Filter ($N_{low}$=2.0, FIG. 10b), and subsequently applied to a high pass TF Spatial Filter ($N_{high}$=10.0, FIG. 10c). The resulting image demonstrated the expected behavior for spatial band pass filtering, with only the medium frequency features being passed by the system.

This example demonstrates two TF Spatial Filters can be combined to create a band pass spatial filter, with one device operated as a low pass and the other as a high pass spatial frequency filter. The center frequency of the resulting band pass filter is determined by the spatial decay parameters of the individual filters, and is therefore tunable, by virtue of examples 1–12.

Example 16

Example 15 demonstrated that two TF spatial filters can be combined to produce a band pass spatial frequency filter. As an example of the utility of band pass spatial frequency filtering, computer simulations were used to implement multipole band pass spatial frequency filtering. This was achieved by repeating the band pass filtering operation described in example 15, with each band pass "block" (FIG. 18) tuned to the same center frequency. FIG. 11 demonstrates an example of multipole bandpass spatial frequency filtering, used for feature selection. In this case, the original image (FIG. 11a), which consisted of three sinusoidally varying grayscale patterns, was subjected to multipole bandpass spatial frequency filtering (via simulation). The center frequency of this filter was tuned to the frequency of the middle pattern. After only 4 passes (poles), the low and high frequency patterns were suppressed, whereas the medium frequency pattern was enhanced; after 6 poles, the low and high frequency patterns were nearly eliminated from the image.

Multipole bandpass spatial frequency filtering was also used to isolate image features (as opposed to patterns) in a 2 dimensional image. FIG. 42 shows the result of multipole bandpass spatial frequency filtering on a grayscale image with a random distribution of three sizes of circles. The bandpass filter was tuned to a region of the spatial frequency domain where the spectral density of the smallest circles was large. After only 3 poles, the medium and large circles are nearly eliminated.

This example demonstrates the utility of TF Spatial Filters used as multipole bandpass spatial frequency filters. Feature selection in complex images can be achieved by simply tuning the center frequency of the bandpass filter block to the desired object, and repeating this process until the desired discrimination is achieved.

Example 17

An example of a variable resistor implemented using a small number of FETs is shown in FIG. 43 [R. Gregorian, *Analog MOS Integrated Circuits for Signal Processing*, Wiley, 1986]. Transistors $Q_1$ and $Q_4$, $Q_2$ and $Q_5$, $Q_3$ and $Q_6$, are assumed to be matched components. $V_{DD}$ is an external bias (for proper circuit operation), and $V_c$ is the control bias, allowing for an external control of the circuit resistance value; the input is applied across the S and D terminals. The current through the S and D terminals can then be described by the expression $$i_{sd} = \frac{V_D - V_S}{R_{eff}} \quad (54)$$

where $$R_{eff} = \frac{1}{2k(V_c - V_T)} \quad (55)$$

is the effective resistance of the circuit. $V_T$ is the FET threshold voltage and $$k = \frac{1}{2}\mu C \frac{W}{L} \quad (56)$$

where $\mu$ is the mobility of the FET material, C is the capacitance per unit area, and W and L are the channel width and length, respectively. According to equation 55, it is clear that a change in the control voltage $V_c$ will result in a corresponding change in $R_{eff}$. Hence this example demonstrates that a variable resistor can be implemented using a small number of FETs, and can be controlled by an external voltage.

What is claimed is:

1. A thin film spatial filter including a single conducting structure of one or two layers of continuous thin film, the conducting structure in electrical connection with a plurality of resistive elements defining pixels, the conducting structure providing lateral blurring for image processing.

2. The thin film spatial filter of claim 1, wherein the conducting structure is made of a first layer of continuous film that is a low resistivity material and a second layer of continuous film that is a high resistivity material.

3. The thin film spatial filter of claim 1 wherein the resistive elements are resistors.

4. The thin film spatial filter of claim 1 wherein the resistive elements are FET components.

5. The thin film spatial filter of claim 1, wherein the conducting structure comprises a conducting polymer.

6. The thin film spatial filter of claim 1, wherein the conducting structure comprises a blend of conducting polymer with an insulating polymer.

7. The thin film spatial filter of claim 1, wherein the conducting structure comprises an organic material selected from conducting conjugated polymers and precursor polymers of conducting conjugated polymers.

8. The thin film spatial filter of claim 1, wherein the conducting structure comprises a material having a resistivity in the range of from $10^{-2}$ Ohm-cm to $10^8$ Ohm-cm.

9. The thin film spatial filter of claim 1, wherein the conducting structure comprises at least one organic material selected from polyaniline, polypyrrole and polythiophene.

10. The thin film spatial filter of claim 1, wherein the conducting structure comprises at least one inorganic material selected from amorphous silicon, indium/tin-oxide, and amorphous carbon.

11. A high pass spatial frequency filter comprising the thin film spatial filter of claim 1.

12. A low pass spatial frequency filter comprising the thin film spatial filter of claim 1.

13. A band pass spatial frequency filter comprising the thin film spatial filter of claim 1.

14. A band pass spatial frequency filter comprising the high pass spacial frequency filter of claim 11 connected in series with a low pass spacial frequency filter.

15. A spatial frequency filter comprising a thin film spatial filter of claim 1.

16. A spatial frequency filter capable of being continuously changed from a low pass filter to a high pass filter, comprising one thin film spatial filter of claim 1.

17. A method of adjusting the resistivity of the thin film spatial filter of claim 1, the method comprising of adjusting the composition at least one of the one or two layers of continuous film to obtain a desired resistivity.

18. A method of adjusting the interpixel resistance of the thin film spatial filter of claim 1, wherein the conducting structure is made of one layer of continuous film, the layer having a layer thickness, the method comprising of adjusting the layer thickness to obtain a desired interpixel resistance.

* * * * *

UNITED STATES PATENT AND TRADEMARK OFFICE
CERTIFICATE OF CORRECTION

PATENT NO. : 6,208,006 B1
DATED : March 27, 2001
INVENTOR(S) : Mcelvain Jon S., Heeger Alan J. and Langan John L.

It is certified that error appears in the above-identified patent and that said Letters Patent is hereby corrected as shown below:

<u>Column 1,</u>
Line 4, after the words "cation 60/053572 filed Jul. 21, 1997." please insert
-- This invention was made with Government support under Contract/Grant N00014-98-C-0156 awarded by the Department of the Navy. The Government has certain rights in the invention. --

Signed and Sealed this

Nineteenth Day of August, 2003

JAMES E. ROGAN
*Director of the United States Patent and Trademark Office*